(12) United States Patent
Jang et al.

(10) Patent No.: US 11,935,908 B2
(45) Date of Patent: Mar. 19, 2024

(54) IMAGE SENSOR INCLUDING A BACK VIA STACK

(71) Applicant: SAMSUNG ELECTRONICS CO., LTD., Suwon-si (KR)

(72) Inventors: Mihye Jang, Hwaseong-si (KR); Seungjoo Nah, Gwangju (KR); Minho Jang, Suwon-si (KR); Heegeun Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 260 days.

(21) Appl. No.: 17/327,885

(22) Filed: May 24, 2021

(65) Prior Publication Data

US 2022/0028915 A1    Jan. 27, 2022

(30) Foreign Application Priority Data

Jul. 27, 2020  (KR) .......................... 10-2020-0093032

(51) Int. Cl.
*H01L 27/146*  (2006.01)
*H01L 21/768*  (2006.01)
(Continued)

(52) U.S. Cl.
CPC .. *H01L 27/14636* (2013.01); *H01L 21/76898* (2013.01); *H01L 24/83* (2013.01); *H01L 27/14634* (2013.01); *H01L 27/1469* (2013.01); *H10K 39/32* (2023.02); *H01L 24/06* (2013.01); *H01L 24/32* (2013.01); *H01L 2224/06155* (2013.01); *H01L 2224/32145* (2013.01);
(Continued)

(58) Field of Classification Search
CPC ......... H01L 27/14636; H01L 27/14634; H01L 24/32; H01L 2224/32145; H01L 27/1463; H10K 39/32
See application file for complete search history.

(56) References Cited

U.S. PATENT DOCUMENTS 8,552,565 B2   10/2013  Yen et al.
9,337,125 B2    5/2016  Park et al.
(Continued)

FOREIGN PATENT DOCUMENTS

KR   10-0728647    6/2007
KR   10-1932660   12/2018

*Primary Examiner* — Jay C Kim
*Assistant Examiner* — Woo K Lee
(74) *Attorney, Agent, or Firm* — F. Chau & Associates, LLC

(57) ABSTRACT

An image sensor includes a first structure including a first substrate, and a first internal wiring structure on the first substrate. The first substrate includes an active pixel region and a through electrode region around the active pixel region. The first internal wiring structure includes a plurality of first internal wiring patterns. The image sensor further includes a second structure including a second substrate and a second internal wiring structure on the second substrate. The second substrate is arranged on the first substrate. The image sensor additionally includes a through electrode layer arranged in the through electrode region to at least partially fill a through electrode trench, which penetrates the first substrate, and to connect the first internal wiring structure to the second internal wiring structure.

11 Claims, 19 Drawing Sheets

(51) Int. Cl.
   *H01L 23/00*   (2006.01)
   *H10K 39/32*   (2023.01)
(52) U.S. Cl.
   CPC .............. *H01L 2224/83931* (2013.01); *H01L 2224/83951* (2013.01)

(56) References Cited

U.S. PATENT DOCUMENTS

| | | |
|---|---|---|
| 9,543,257 B2 | 1/2017 | Tsai et al. |
| 9,960,080 B2 | 5/2018 | Beyne |
| 2008/0258250 A1 | 10/2008 | Uenishi |
| 2016/0211390 A1 | 7/2016 | Chen et al. |
| 2020/0006128 A1 | 1/2020 | Weng et al. |
| 2020/0105836 A1* | 4/2020 | Kim ....................... H10K 19/20 |

* cited by examiner

IMAGE SENSOR INCLUDING A BACK VIA STACK

CROSS-REFERENCE TO RELATED APPLICATION

This application claims priority under 35 U.S.C. § 119 to Korean Patent Application No. 10-2020-0093032, filed on Jul. 27, 2020, in the Korean Intellectual Property Office, the disclosure of which is incorporated by reference herein in its entirety.

TECHNICAL FIELD

The present inventive concept relates to an image sensor, and more particularly, to an image sensor including a back via stack.

DISCUSSION OF THE RELATED ART

Generally, image sensors, which take images and convert the images into electrical signals, are used in electronic devices for general consumers, such as digital cameras, cameras for mobile phones, and portable camcorders, and also used in cameras mounted in vehicles, security devices, and robots. Therefore, image sensors have been under development to simultaneously have reduced sizes and a higher resolution, and thus, together with methods of reducing sizes of respective pixels of the image sensors, methods of increasing proportions of regions occupied by the pixels in total areas of the image sensors have been under development.

SUMMARY

According to an exemplary embodiment of the present inventive concept, an image sensor includes: a first structure including a first substrate and a first internal wiring structure on the first substrate, wherein the first substrate includes a first surface, a second surface opposite to the first surface, an active pixel region, and a through electrode region around the active pixel region, wherein a plurality of active pixels are arranged in the active pixel region, and wherein the first internal wiring structure includes a plurality of first internal wiring patterns; a second structure including a second substrate and a second internal wiring structure on the second substrate, wherein the second substrate includes a driving circuit configured to drive the plurality of active pixels and is arranged on the first substrate, and wherein the second internal wiring structure is electrically connected to the driving circuit; and a through electrode layer in the through electrode region, wherein the through electrode layer at least partially fills a through electrode trench and connects the first internal wiring structure to the second internal wiring structure. The plurality of first internal wiring patterns include a first wiring pattern having a first opening, a second wiring pattern having a second opening, and a third wiring pattern having a third opening, wherein the first wiring pattern, the second wiring pattern, and the third wiring pattern are at different levels from each other sequentially from the first surface of the first substrate. The through electrode layer contacts each of a connection portion of the second wiring pattern and a connection portion of the third wiring pattern due to the through electrode trench extending through the first opening, the second opening, and the third opening, wherein the connection portion of the second wiring pattern has a rectangular shape, and the connection portion of the third wiring pattern has a U shape.

According to an exemplary embodiment of the present inventive concept, an image sensor includes: a first structure including a first substrate and a first internal wiring structure, wherein the first substrate includes a first surface, a second surface opposite to the first surface, an active pixel region and a through electrode region around the active pixel region, wherein a plurality of active pixels are arranged in the active pixel region, wherein the first internal wiring structure includes a first wiring pattern having a first opening, a second wiring pattern having a second opening, a third wiring pattern having a third opening, and a fourth wiring pattern having a fourth opening, wherein the first wiring pattern, the second wiring pattern, the third wiring pattern, and the fourth wiring pattern are sequentially arranged in the stated order vertically away from the first surface of the first substrate; a second structure including a second substrate and a second internal wiring structure on the second substrate, wherein a driving circuit configured to drive the plurality of active pixels is arranged in the second substrate, wherein the second substrate is arranged on the first surface of the first substrate, and wherein the second internal wiring structure is electrically connected to the driving circuit; and a through electrode layer arranged in the through electrode region to at least partially fill a through electrode trench and electrically connect the first internal wiring structure to the second internal wiring structure, wherein the through electrode trench penetrates the first substrate and extends through the first opening, the second opening, the third opening, and the fourth opening. Each of the first opening, the second opening, the third opening, and the fourth opening has a rectangular shape, and the first opening, the second opening, the third opening, and the fourth opening are aligned with each other with respect to one side from among four sides of each rectangular shape of the first opening, the second opening, the third opening, and the fourth opening. The fourth opening is not aligned with the first opening, the second opening, and the third opening with respect to remaining three sides of each rectangular shape of the first opening, the second opening, the third opening, and the fourth opening.

According to an exemplary embodiment of the present inventive concept, an image sensor includes: a first structure including a first substrate, a first internal wiring structure, a first interlayer dielectric surrounding the first internal wiring structure, and a first cover insulating film covering the first internal wiring structure and the first interlayer dielectric, wherein the first substrate includes a first surface and a second surface opposite to the first surface, wherein the first structure includes an active pixel region and a through electrode region around the active pixel region, wherein the active pixel region includes a plurality of active pixels, wherein the first internal wiring structure includes a first wiring pattern having a first opening, a second wiring pattern having a second opening, a third wiring pattern having a third opening, and a fourth wiring pattern having a fourth opening, wherein the first wiring pattern, the second wiring pattern, the third wiring pattern, and the fourth wiring pattern are sequentially arranged in the stated order vertically away from the first surface of the first substrate; a second structure including a second substrate, a second internal wiring structure on the second substrate, a second interlayer dielectric surrounding the second internal wiring structure, and a second cover insulating film that covers the second internal wiring structure and the second interlayer dielectric and contacts the first cover insulating film, wherein the second substrate includes a driving circuit configured to drive the plurality of active pixels and is arranged on the first substrate, and wherein the second internal wiring structure includes a stack connection pad and is electrically connected to the driving circuit; and a through electrode layer arranged in the through electrode region to cover an inner wall and a bottom surface of a through electrode trench and electrically connect the first internal wiring structure to the second internal wiring structure by contacting the second wiring pattern, the third wiring pattern, the fourth wiring pattern, and the stack connection pad, wherein the through electrode trench extends through the first opening, the second opening, the third opening, and the fourth opening and penetrates the first substrate, the first interlayer dielectric, the first cover insulating film, and the second cover insulating film. Each of the first opening, the second opening, the third opening, and the fourth opening has a rectangular shape, and the first opening, the second opening, the third opening, and the fourth opening are aligned with each other with respect to one side from among four sides of each rectangular shape of the first opening, the second opening, the third opening, and the fourth opening. A portion of the fourth wiring pattern contacts the through electrode layer, wherein the portion of the fourth wiring pattern is adjacent to remaining three sides of the rectangular shape of the fourth opening, wherein the remaining three sides of the rectangular shape of the fourth opening are not vertically aligned with remaining three sides of the rectangular shape of each of the first opening, the second opening, and the third opening.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Figure 1:
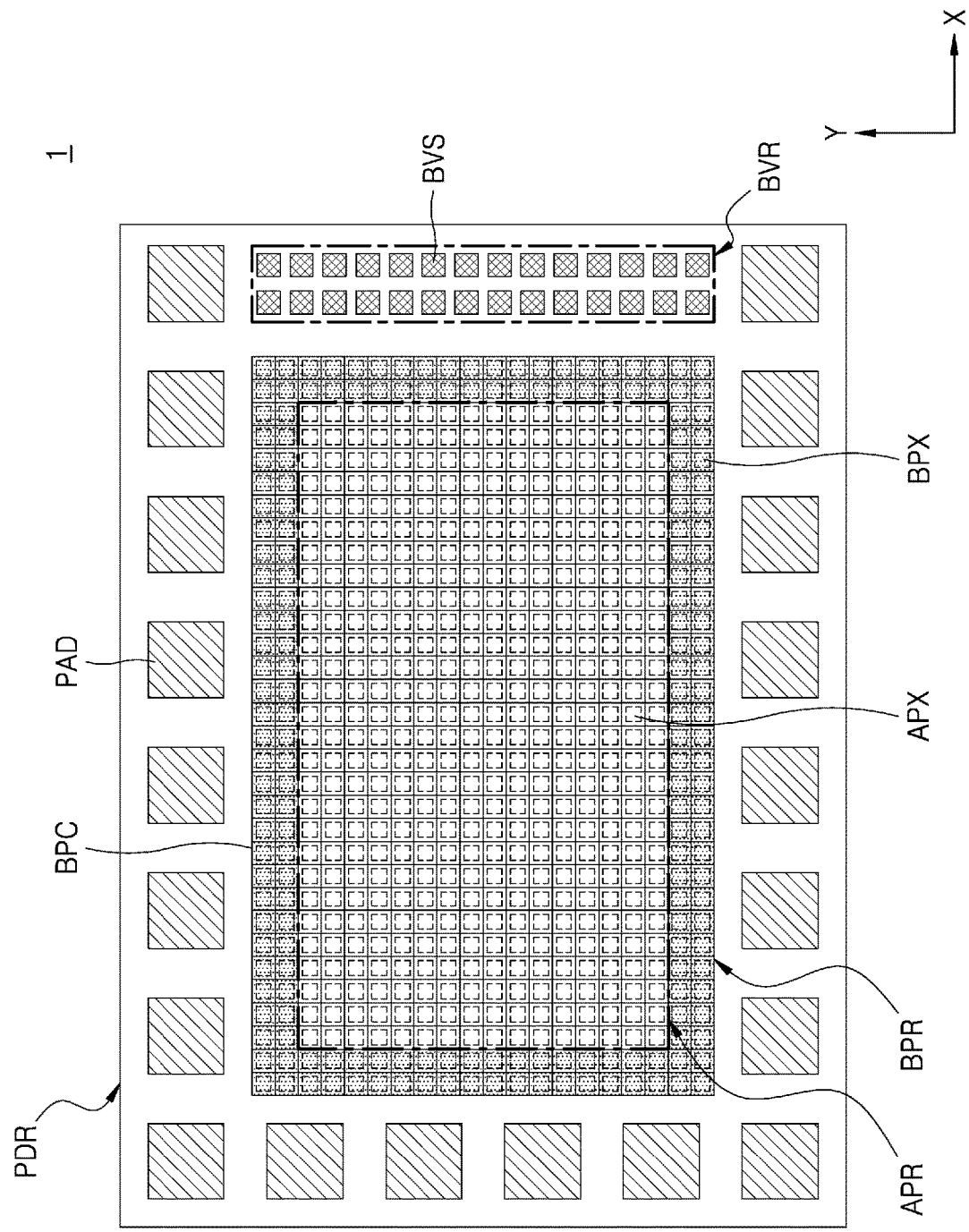
FIG. 1 is a planar layout illustrating an image sensor, according to an exemplary embodiment of the present inventive concept.

FIG. 1 is a planar layout illustrating an image sensor, according to an exemplary embodiment of the present inventive concept.

Referring to FIG. 1, an image sensor 1 includes an active pixel region APR, a dark pixel region BPR, a through electrode region BVR, and a power supply region PDR. In an exemplary embodiment of the present inventive concept, the dark pixel region BPR may be arranged to surround the active pixel region APR. For example, in a plan view, the dark pixel region BPR may include a portion extending in a first horizontal direction (X direction) and a portion extending in a second horizontal direction (Y direction) while surrounding the active pixel region APR. In an exemplary embodiment of the present inventive concept, the dark pixel region BPR may be arranged on both sides of the active pixel region APR.

In an exemplary embodiment of the present inventive concept, the dark pixel region BPR may at least partially surround the active pixel region APR.

A plurality of active pixels APX and a plurality of dark pixels BPX are arranged in the active pixel region APR and the dark pixel region BPR, respectively. Although an active pixel APX has a substantially identical configuration to that of a dark pixel BPX, the active pixel APX may be used to obtain actual pixel information, and the dark pixel BPX may be used to measure a dark current. A light blocking layer BPC may cover the dark pixel region BPR. For example, the light blocking layer BPC may cover the entire dark pixel region BPR. The dark, pixel region BPR may function as a reference pixel for the active pixel region APR and may perform a function of automatically correcting a dark signal. For example, the light blocking layer BPC may block light from entering the dark pixel BPX, and thus, a reference quantity of electric charge, which may be generated in the dark pixel BPX blocked from light, may be measured and compared with a sensing quantity of electric charge generated from the active pixel APX, whereby an optical signal that is input from the active pixel APX may be calculated from a difference between the sensing quantity of electric charge of the active pixel APX and the reference quantity of electric charge of the dark pixel BPX.

In an exemplary embodiment of the present inventive concept, the through electrode region BVR and the power supply region PDR may be arranged around the active pixel region APR and the dark pixel region BPR. Although an example, in which the through electrode region BVR is arranged on one side of the active pixel region APR and the power supply region PDR is arranged on the remaining sides of the active pixel region APR, is illustrated, the present inventive concept is not limited thereto. For example, the through electrode region BVR and the power supply region PDR may be respectively arranged in any different region around the active pixel region APR and the dark pixel region BPR.

Herein, in the image sensor, the power supply region PDR may refer to all regions except for the active pixel region APR, the dark pixel region BPR, and the through electrode region BVR. For example, in the power supply region PDR, circuits for processing power, control signals of the image sensor, and/or pixel signals obtained from the image sensor, and wiring lines for the connection thereof may be arranged.

A plurality of pads PAD may be arranged in the power supply region PDR. The plurality of pads PAD may be arranged in the power supply region PDR along the periphery of the active pixel region APR and the dark pixel region BPR. Some of the plurality of pads PAD may be DC pads to which DC power is provided from outside the image sensor, and some others thereof may be pads to which AC power, DC power, or control signals are provided from outside the image sensor, or pads via which data signals are transmitted and received between the image sensor and the outside thereof.

In the through electrode region BVR, a plurality of through electrode structures BVS may be arranged. The plurality of through electrode structures BVS may include a through electrode structure 180 shown in FIGS. 2A and 2B or a through electrode structure 180*a* shown in FIGS. 4A and 4B, and the through electrode structure 180 and 180*a* will be described in detail with reference to FIGS. 2A, 2B, 4A, and 4B. The plurality of through electrode structures BVS may be referred to as a back via stack.

Figure 2A:
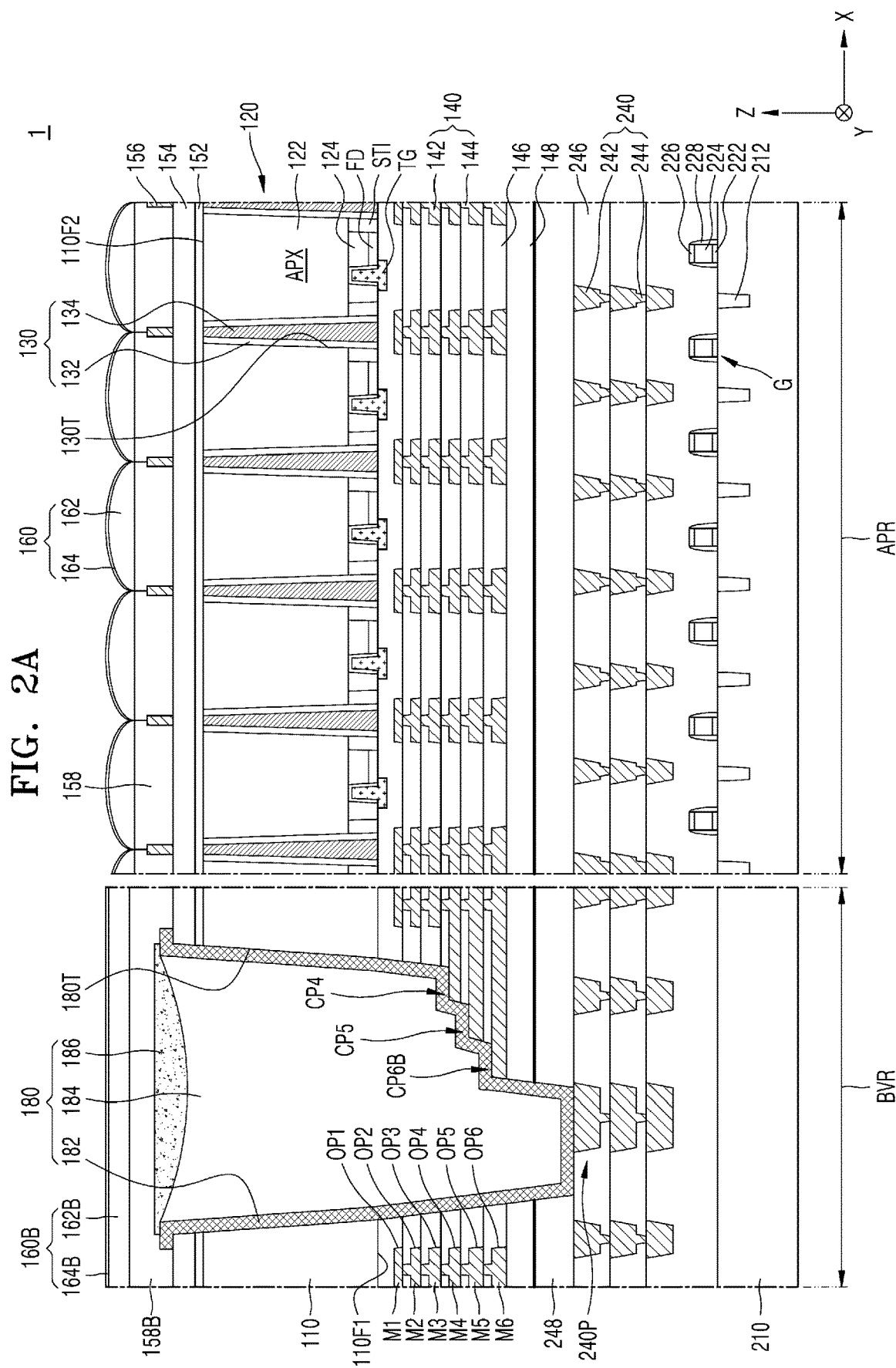
FIGS. 2A and 2B are each a cross-sectional view illustrating an image sensor, according to exemplary embodiment of the present inventive concept.
Figure 2B:
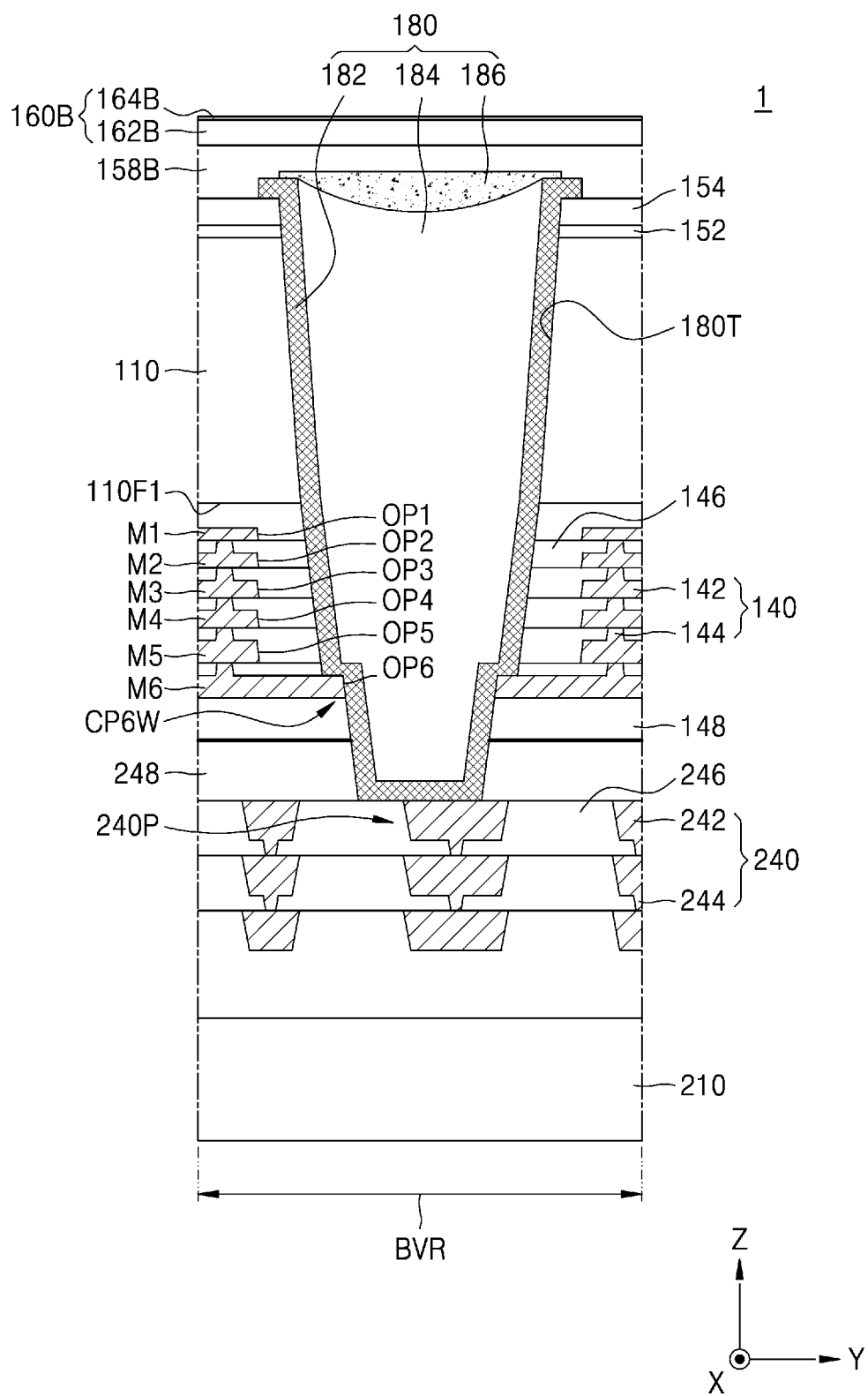

FIGS. 2A and 2B are each a cross-sectional view illustrating an image sensor, according to an exemplary embodiment of the present inventive concept. For example, FIG. 2A is a cross-sectional view of each of the active pixel region APR and the through electrode region BVR of the image sensor 1, taken along an X-Z plane, and FIG. 2B is a cross-sectional view of the through electrode region BVR of the image sensor 1, taken along an X-Y plane.

Referring together to FIGS. 2A and 2B, the image sensor 1 may have a stack structure in which a first substrate 110 and a second substrate 210 are bonded to each other. The image sensor 1 may include the active pixel region APR, which is formed in the first substrate 110, and the through electrode region BVR. The image sensor 1 may further include the dark pixel region BPR and the power supply region PDR, which are shown in FIG. 1.

The first substrate 110 may include a first surface 110F1 and a second surface 110F2, which are opposite to each other. For example, a color filter layer 158 may be disposed on the second surface 110F2 of the first substrate 110. However, the present inventive concept is not limited thereto.

The first substrate 110 may include a P-type semiconductor substrate. For example, the first substrate 110 may include a P-type silicon substrate. In an exemplary embodiment of the present inventive concept, the first substrate 110 may include a P-type bulk substrate and a P-type or N-type epi-layer grown thereon. In an exemplary embodiment of the present inventive concept, the first substrate 110 may include an N-type bulk substrate and a P-type or N-type epi-layer grown on the N-type bulk substrate. In addition, the first substrate 110 may include an organic plastic substrate.

In the active pixel region APR, the plurality of active pixels APX may be arranged in a matrix form in the first substrate 110. A plurality of photoelectric conversion regions 120 may be respectively arranged in the plurality of active pixels APX. Each of the plurality of photoelectric conversion regions 120 may include a photodiode region 122 and a well region 124.

In the active pixel region APR, a pixel device isolation film 130 may be arranged in the first substrate 110, and the plurality of active pixels APX may be defined by the pixel device isolation film 130. The pixel device isolation film 130 may be arranged between adjacent photoelectric conversion regions 120. One photoelectric conversion region 120 and another photoelectric conversion region 120 adjacent thereto may be physically and electrically separated from each other by the pixel device isolation film 130. For example, the pixel device isolation film 130 may be arranged between the respective plurality of photoelectric conversion regions 120 arranged in a matrix form and may have a grid or mesh shape in a plan view.

The pixel device isolation film 130 may be formed in a pixel trench 130T penetrating the first substrate 110 from the first surface 110F1 to the second surface 110F2 of the first substrate 110. The pixel device isolation film 130 may include an insulating liner 132, which is conformally formed on a sidewall of the pixel trench 130T, and a filling conductive layer 134 arranged on the insulating liner 132 to fill an inside of the pixel trench 130T. In an exemplary embodiment of the present inventive concept, the insulating liner 132 may include a metal oxide such as hafnium oxide, aluminum oxide, and/or tantalum oxide. In an exemplary embodiment of the present inventive concept, the insulating liner 132 may include an insulating material such as silicon oxide, silicon nitride, and/or silicon oxynitride. The filling conductive layer 134 may include, for example, at least one of doped polysilicon, a metal, a metal silicide, a metal nitride, and/or a metal-containing film.

In an exemplary embodiment of the present inventive concept, the pixel device isolation film 130 may have a tapered shape, which extends from the first surface 110F1 of the first substrate 110 to the second surface 110F2 of the first substrate 110 with a decreasing horizontal width in a first horizontal direction (e.g., an X direction) toward the second surface 110F2 of the first substrate 110.

A device isolation film STI may be formed on the first surface 11F1 of the first substrate 110, and the device isolation film STI provides an active region and a floating diffusion region FD. Gate electrodes, which are included in a plurality of transistors, may be formed on the first surface 110F1 of the first substrate 110. For example, the plurality of transistors may include a transmission transistor, a reset transistor, a drive transistor, and a selection transistor. The transmission transistor is configured to transmit electric charges generated in the photoelectric conversion region 120 to the floating diffusion region FD, and the reset transistor is configured to cyclically reset the electric charges stored in the floating diffusion region FD. The drive transistor functions as a source follower buffer amplifier and configured to buffer signals according to the electric charges filling the floating diffusion region FD, and the selection transistor is configured to perform switching and addressing to select the active pixel region APR. However, the plurality of transistors are not limited thereto.

In FIG. 2A, a transmission gate TG of the transmission transistor, from among the gate electrodes included in the plurality of transistors, is illustrated as an example. For example, the transmission gate TG of the transmission transistor is formed in a recessed gate type to extend from the first surface 110F1 of the first substrate 110 to an inside of the first substrate 110. However, the shape of the transmission gate TG is not limited thereto.

A first internal wiring structure 140 may be arranged on the first surface 110F1 of the first substrate 110. The first internal wiring structure 140 may be electrically connected to the gate electrodes or to the active region of the first substrate 110. For example, the first internal wiring structure 140 may include tungsten, aluminum copper, tungsten silicide, titanium silicide, tungsten nitride, titanium nitride, doped polysilicon, and/or the like.

The first internal wiring structure 140 may include a stack structure of a plurality of first internal wiring patterns 142 and a plurality of first internal wiring vias 144. In an exemplary embodiment of the present inventive concept, the first internal wiring structure 140 may be formed by a damascene process. In an exemplary embodiment of the present inventive concept, at least one of the plurality of first internal wiring patterns 142 and at least one of the plurality of first internal wiring vias 144 may be formed together to be integrated with each other. In an exemplary embodiment of the present inventive concept, the plurality of first internal wiring patterns 142 and the plurality of first internal wiring vias 144 may each have a tapered shape. For example, the plurality of first internal wiring patterns 142 and the plurality of first internal wiring vias 144 may each extend with a decreasing horizontal width from the bottom toward the top thereof. For example, the plurality of first internal wiring patterns 142 and the plurality of first internal wiring vias 144 may each have an increasing horizontal width with an increasing distance from the first substrate 110.

The plurality of first internal wiring patterns 142 may include a first wiring pattern M1, a second wiring pattern M2, a third wiring pattern M3, a fourth wiring pattern M4, a fifth wiring pattern M5, and a sixth wiring pattern M6, which are at different vertical levels from each other. For example, the first wiring pattern M1, the second wiring pattern M2, the third wiring pattern M3, the fourth wiring pattern M4, the fifth wiring pattern M5, and the sixth wiring pattern M6 may be sequentially arranged in the stated order away from the first surface 110F1 of the first substrate 110 in a vertical direction (e.g., a Z direction). For example, the plurality of first internal wiring patterns 142 may have thicknesses of about 750 μm to about 2000 μm. In an exemplary embodiment of the present inventive concept, from among the plurality of first internal wiring patterns 142, the sixth wiring pattern M6 may have a maximum thickness, and the first wiring pattern M1 may have a minimum thickness.

The first wiring pattern M1, the second wiring pattern M2, the third wiring pattern M3, the fourth wiring pattern M4, the fifth wiring pattern M5, and the sixth wiring pattern M6 may be disposed in a first opening OP1, a second opening OP2, a third opening OP3, a fourth opening OP4, a fifth opening OP5, and a sixth opening OP6, respectively. Horizontal cross-sectional areas of spaces respectively provided by the first opening OP1, the second opening OP2, the third opening OP3, the fourth opening OP4, the fifth opening OP5, and the sixth opening OP6 may respectively have equal or smaller values with an increasing distance from the first surface 110F1 of the first substrate 110. In the vertical direction (e.g., the Z direction), the sixth opening OP6 may overlap the fifth opening OP5, and the fifth opening OP5 may overlap the fourth opening OP4. In addition, the fourth opening OP4 may overlap the third opening OP3, and the third opening OP3 may overlap the second opening OP2. In addition, the second opening OP2 may overlap the first opening OP1. In an exemplary embodiment of the present inventive concept, in the vertical direction (e.g., the Z direction), the first opening OP1, the second opening OP2, and the third opening OP3 may overlap each other.

Respective portions of the fourth wiring pattern M4, the fifth wiring pattern M5, and the sixth wiring pattern M6, which respectively face aligned sides of the fourth opening OP4, the fifth opening OP5, and the sixth opening OP6 and are respectively adjacent to non-aligned sides of the fourth opening OP4, the fifth opening OP5, and the sixth opening OP6, may form a stepwise structure together. The aligned sides may correspond to one side from among four sides of each quadrangular shape of each of the fourth opening OP4, the fifth opening OP5, and the sixth opening OP6 and may be aligned with each other. The non-aligned sides may correspond to another side of each quadrangular shape thereof and may not be aligned with each other.

A first interlayer dielectric 146 may be arranged on the first substrate 110 to at least partially surround the first internal wiring structure 140. For example, the first interlayer dielectric 146 may be disposed on the first surface 110F1. The first interlayer dielectric 146 may include an insulating material such as silicon oxide, silicon nitride, and/or silicon oxynitride. A first cover insulating film 148 may cover the first internal wiring structure 140 and the first interlayer dielectric 146. The first cover insulating film 148 may include, for example, silicon oxide.

A backside insulating layer 152 may be arranged on the first substrate 110. For example, the backside insulating layer 152 may be disposed on the second surface 110F2. In an exemplary embodiment of the present inventive concept, the backside insulating layer 152 may cover the second surface 110F2 of the first substrate 110 in the active pixel region APR and may cover at least a portion of the second surface 110F2 of the first substrate 110 in the through electrode region BVR. For example, the backside insulating layer 152 may completely cover the second surface 110F2 of the first substrate 110 in the active pixel region APR. For example, the backside insulating layer 152 may contact a top surface of the pixel device isolation film 130, and the top surface of the pixel device isolation film 130 is at the same vertical level as the second surface 110F2 of the first substrate 110. In an exemplary embodiment of the present inventive concept, the backside insulating layer 152 may include a metal oxide such as aluminum oxide or tantalum oxide. A passivation layer 154 may be arranged over the second surface 110F2 of the first substrate 110 to cover the backside insulating layer 152. The passivation layer 154 may include, for example, an oxide, a nitride, an oxynitride, or a combination thereof. In an exemplary embodiment of the present inventive concept, the passivation layer 154 may include a stack structure of hafnium oxide, silicon nitride, and hafnium oxide.

A guide pattern 156 may be formed on the passivation layer 154 in the active pixel region APR. For example, in a plan view, the guide pattern 156 may have a grid shape or a mesh shape. For example, the guide pattern 156 may have a tilt angle toward one photoelectric conversion region 120 and may prevent incident light from entering an adjacent photoelectric conversion region 120. The guide pattern 156 may include, for example, a metal material including at least one of tungsten, aluminum, titanium, ruthenium, cobalt, nickel, copper, gold, silver, and/or platinum.

In the active pixel region APR, a color filter layer 158, which overlaps the photoelectric conversion region 120, and a microlens 160, which is disposed on the color filter layer 158, may be formed on the passivation layer 154 on which the guide pattern 156 is formed. The color filter layer 158 may allow only light having a predetermined wavelength to enter the photoelectric conversion region 120 by passing light that is incident through the microlens 160.

The color filter layer 158 may include, for example, a red (R) filter, a blue (B) filter, and a green (G) filter. In addition, the color filter layer 158 may include a cyan (C) filter, a yellow (Y) filter, and a magenta (M) filter. The color filter layer 158 including one of the R filter, the B filter, or the G filter, or the color filter layer 158 including one of the C filter, the Y filter, or the M filter may be formed over each active pixel APX, and thus, each active pixel APX may recognize one color by sensing a separated component of incident light.

The microlens 160 may concentrate light, which is incident on the image sensor 1, on the active pixel APX. In an exemplary embodiment of the present inventive concept, the microlens 160 may include an organic layer 162 and an inorganic layer 164 conformally covering a surface of the organic layer 162. For example, the organic layer 162 may include a TMR-based resin (from, for example, Tokyo Ohka Kogyo, Co. Ltd.) or an MFR-based resin (from, for example, Japan Synthetic Rubber Corporation).

In the through electrode region BVR, a bulk color filter layer 158B and a bulk protection layer 160B on the bulk color filter layer 158B may be formed on the passivation layer 154, which covers a through electrode structure 180. In an exemplary embodiment of the present inventive concept, the bulk color filter layer 158B may include a B filter. The bulk color filter layer 158B may block infrared light from entering the through electrode structure 180. The bulk protection layer 160B may include a bulk organic layer 162B and a bulk inorganic layer 164B conformally covering a top surface of the bulk organic layer 162B. The bulk organic layer 162B may cover a top surface of the bulk color filter layer 158B with a substantially uniform thickness. In an exemplary embodiment of the present inventive concept, the bulk organic layer 162B and the bulk inorganic layer 164B may be respectively formed together with the organic layer 162 and the inorganic layer 164 and may respectively include the same materials as the organic layer 162 and the inorganic layer 164.

The second substrate 210 may include a semiconductor substrate. The second substrate 210 may include a driving circuit configured to drive the plurality of active pixels APX arranged in the first substrate 110. An active region, which is provided by a device isolation film 212, may be formed in the second substrate 210. A gate structure G may be arranged on the second substrate 210. The gate structure G may include a gate insulating layer 222, a gate electrode 224, and a gate capping layer 226, which are sequentially arranged on the second substrate 210 in the stated order. The gate structure G may further include a spacer 228 arranged on sidewalls of the gate insulating layer 222, the gate electrode 224, and the gate capping layer 226.

The gate structure G may provide a certain signal to each photoelectric conversion region 120 in the active pixel region APR or may constitute a plurality of CMOS transistors to control an output signal from each photoelectric conversion region 120. For example, the CMOS transistors may constitute various logic circuits to configure the driving circuit configured to drive the plurality of active pixels APX.

A second internal wiring structure 240, which is electrically connected to the driving circuit configured to drive the plurality of active pixels APX, may be arranged on the second substrate 210. The second internal wiring structure 240 may be electrically connected to the gate structure G and to the active region of the second substrate 210. For example, the second internal wiring structure 240 may include tungsten, aluminum, copper, tungsten silicide, titanium silicide, tungsten nitride, titanium nitride, doped polysilicon, and/or the like.

The second internal wiring structure 240 may include a stack structure of a plurality of second internal wiring patterns 242 and a plurality of second internal wiring vias 244. In an exemplary embodiment of the present inventive concept, the second internal wiring structure 240 may be formed by a damascene process. In an exemplary embodiment of the present inventive concept, at least one of the plurality of second internal wiring patterns 242 and at least one of the plurality of second internal wiring vias 244 may be formed together to be integrated with each other. In an exemplary embodiment of the present inventive concept, each of the plurality of second internal wiring vias 244 may have a tapered shape extending with a decreasing horizontal width from the bottom toward the top thereof. For example, each of the plurality of second internal wiring vias 244 may have an increasing horizontal width with an increasing distance from the second substrate 210. In an exemplary embodiment of the present inventive concept, a line width of a second internal wiring pattern 242 may be less than a line width of a first internal wiring pattern 142, and a thickness of the second internal wiring pattern 242 may be greater than a thickness of the first internal wiring pattern 142. However, the present inventive concept is not limited thereto. For example, the line width of a second internal wiring pattern 242 may be greater than or equal to a line width of a first internal wiring pattern 142, and a thickness of the second internal wiring pattern 242 may be less than or equal to a thickness of the first internal wiring pattern 142.

The second interlayer dielectric 246 may be arranged on the second substrate 210 to cover the gate structure G and the second internal wiring structure 240. The second interlayer dielectric 246 may include an insulating material such as silicon oxide, silicon nitride, silicon oxynitride, or the like. The second cover insulating film 248 may cover the second internal wiring structure 240 and the second interlayer dielectric 246. The second cover insulating film 248 may include, for example, silicon oxide. The second cover insulating film 248 may be attached to the first cover insulating film 148. In the image sensor 1, relative to a boundary between the first cover insulating film 148 and the second cover insulating film 248, an upper portion including the first substrate 110 may be referred to as a first structure, and a lower portion including the second substrate 210 may be referred to as a second structure. For example, the image sensor 1 may be formed by stacking the first structure on the second structure.

The through electrode trench 180T may expose a portion of the second internal wiring structure 240 at a bottom surface of the through electrode trench 180T, and may penetrate the passivation layer 154, the backside insulating layer 152, the first substrate 110, the first interlayer dielectric 146, the first cover insulating film 148, and the second cover insulating film 248. The through electrode trench 180T may extend through the first opening OP1, the second opening OP2, the third opening OP3, the fourth opening OP4, the fifth opening OP5, and the sixth opening OP6. The portion of the second internal wiring structure 240, which is exposed at the bottom surface of the through electrode trench 180T, may be referred to as a stack connection pad 240P. For example, the stack connection pad 240P may be a portion of the second internal wiring pattern 242, which is at a vertical level farthest from the second substrate 210, from among the plurality of second internal wiring patterns 242. In an exemplary embodiment of the present inventive concept, the through electrode trench 180T may have a tapered shape extending with a decreasing horizontal width from the first substrate 110 toward the second substrate 210.

For example, the through electrode trench 180T may have a polygonal shape in a plan view. For example, the through electrode trench 180T may have rectangular shape in a plan view. In a plan view, a horizontal cross-sectional area of a space formed by the through electrode trench 180T may be less than a horizontal cross-sectional area of a space formed by each of the first opening OP1, the second opening OP2, and the third opening OP3, which are respectively included in the first wiring pattern M1, the second wiring pattern M2, and the third wiring pattern M3. For example, the horizontal cross-sectional area of the space formed by the through electrode trench 180T may be less than the horizontal cross-sectional area of the space formed by the first opening OP1 at the same vertical level as the first wiring pattern M1, than the horizontal cross-sectional area of the space formed by the second opening OP2 at the same vertical level as the second wiring pattern M2, and than the horizontal cross-sectional area of the space formed by the third opening OP3 at the same vertical level as the third wiring pattern M3.

For example, the space formed by the through electrode trench 180T may be apart from the first wiring pattern M1 and may be included in the space formed by the first opening OP1, may be apart from the second wiring pattern M2 and may be included in the space formed by the second opening OP2, and may be apart from the third wiring pattern M3 and may be included in the space formed by the third opening OP3.

In the through electrode trench 180T, a portion of the first internal wiring structure 140 may be exposed. In an exemplary embodiment of the present inventive concept, in the through electrode trench 180T, the first wiring pattern M1, the second wiring pattern M2, and the third wiring pattern M3 may not be exposed, and respective portions of the fourth wiring pattern M4, the fifth wiring pattern M5, and the sixth wiring pattern M6 may be exposed.

In the through electrode trench 180T, a connection portion CP4 of the fourth wiring pattern M4 may be exposed, and is a portion of the fourth wiring pattern M4, which is adjacent to one inner side surface of the fourth wiring pattern M4. In the through electrode trench 180T, a connection portion CP5 of the fifth wiring pattern M5 may be exposed, and is a portion of the fifth wiring pattern M5, which is adjacent to one inner side surface of the fifth wiring pattern M5. In the through electrode trench 180T, a portion of the sixth wiring pattern M6, which is adjacent to three inner side surfaces of the sixth wiring pattern M6, may be exposed. For example, in the through electrode trench 180T, a base connection portion CP6B of the sixth wiring pattern M6 and wing portions CP6W of the sixth wiring pattern M6 may be exposed. In addition, the base connection portion CP6B is a portion of the sixth wiring pattern M6 adjacent to one inner side surface of the sixth wiring pattern M6, and the wing portions CP6W are portions of the sixth wiring pattern M6 respectively adjacent to the other two inner side surfaces of the sixth wiring pattern M6. The base connection portion CP6B of the sixth wiring pattern M6 and the wing portions CP6W of the sixth wiring pattern M6 may be collectively referred to as a connection portion (CP6 in FIGS. 3A and 3B) of the sixth wiring pattern M6.

In an exemplary embodiment of the present inventive concept, the connection portion CP4 of the fourth wiring pattern M4, the connection portion CP5 of the fifth wiring pattern M5, and the base connection portion CP6B of the sixth wiring pattern M5 may respectively have bar shapes extending in the second horizontal direction (e.g., Y direction) and may form, together, a stepwise structure. The wing portions CP6W of the sixth wiring pattern M6 may have bar shapes extending in the first horizontal direction (e.g., an X direction). The wing portions CP6W of the sixth wiring pattern M6 may include two portions respectively extending from both ends of the base connection portion CP6B of the sixth wiring pattern M6 in the first horizontal direction (e.g., the X direction) different from the second horizontal direction (e.g., the Y direction), which is an extension direction of the base connection portion CP6B of the sixth wiring pattern M6. For example, the connection portion CP6 of the sixth wiring pattern M6, which is exposed by the through electrode trench 180T, may have a U shape or square shape with an open side in a plan view.

The through electrode structure 180 may include a through electrode layer 182, which conformally covers the inner sidewall and the bottom surface of the through electrode trench 180T, and a filling insulating layer 184, which covers the through electrode layer 182 and at least partially fills the through electrode trench 180T. In an exemplary embodiment of the present inventive concept, the through electrode structure 180 may include a cover insulating layer 186, which fills an upper portion of the through electrode trench 180T. The cover insulating layer 186 may be formed on an uppermost end of the through electrode layer 182 while filling the upper portion of the through electrode trench 180T. The covering insulating layer 186 may be disposed on the filling insulating layer 184. The through electrode layer 182 may include, for example, a metal material, such as titanium, titanium nitride, tantalum, tantalum nitride, titanium tungsten, tungsten, aluminum, cobalt, nickel, or copper, or an alloyed material thereof. In an exemplary embodiment of the present inventive concept, the through electrode layer 182 may be formed by a chemical vapor deposition (CVD) process or an atomic layer deposition (ALD) process. For example, the through electrode layer 182 may have a thickness of about 2 μm to about 4 μm. The filling insulating layer 184 may include, for example, an insulating material such as silicon oxide or silicon nitride. In an exemplary embodiment of the present inventive concept, the filling insulating layer 184 may include, for example, tetraethyl orthosilicate (TEOS) or plasma enhanced-TEOS (PE-TEOS). In an exemplary embodiment of the present inventive concept, the through electrode structure 180 may include only the through electrode layer 182 completely filling the inside of the through electrode trench 180T without including the filling insulating layer 184. The cover insulating layer 186 may be formed by using, for example, a photoresist. In an exemplary embodiment of the present inventive concept, when the filling insulating layer 184 completely fills the remaining portion of the through electrode trench 180T, the through electrode structure 180 may not include the cover insulating layer 186.

The through electrode layer 182 may contact and be electrically connected to respective portions of the fourth wiring pattern M4, the fifth wiring pattern M5, and the sixth wiring pattern M6, which are portions of the first internal wiring structure 140. For example, the through electrode layer 182 may contact and be electrically connected to the connection portion CP4 of the fourth wiring pattern M4, the connection portion CP5 of the fifth wiring pattern M5, and the connection portion CP6 of the sixth wiring pattern M6, and the connection portion CP6 includes the base connection portion CP6B of the sixth wiring pattern M6 and the wing portions CP6W of the sixth wiring pattern M6. The through electrode layer 182 may contact and be electrically connected to the stack connection pad 240P, which is a portion of the second internal wiring structure 240. Accordingly, the through electrode layer 182 may electrically connect the first internal wiring structure 140 to the second internal wiring structure 240. For example, the through electrode layer 182 may have a shape that conforms to the shape formed by the connection portion CP4 of the fourth wiring pattern M4, the connection portion CP5 of the fifth wiring pattern M5, and the base connection portion CP6B of the sixth wiring pattern M6. For example, the through electrode layer 182 may have a stepwise shape along top and side surfaces of each of the connection portion CP4 of the fourth wiring pattern M4, the connection portion CP5 of the fifth wiring pattern M5, and the base connection portion CP6B of the sixth wiring pattern M6. For example, the through electrode layer 182 may have a stepwise shape along top and side surfaces of the wing portions CP6W of the sixth wiring pattern M6.

A lower region of the through electrode layer 182, which is below the first internal wiring structure 140, may be at least partially surrounded by the first cover insulating film 148 and the second cover insulating film 248. An upper region of the through electrode layer 182, which is above the first internal wiring structure 140, may be at least partially surrounded by the first substrate 110 and the backside insulating layer 152. A portion of an intermediate region of the through electrode layer 182 between the upper region and the lower region of the through electrode layer 182 may be at least partially surrounded by the first interlayer dielectric 146, and the portion of the intermediate region of the through electrode layer 182 does not contact the first internal wiring structure 140.

In the image sensor 1 according to an exemplary embodiment of the present inventive concept, the first internal wiring structure 140 may be electrically connected to the second internal wiring structure 240 by the through electrode layer 182 at least partially filling the through electrode trench 180T that extends though the first opening OP1, the second opening OP2, the third opening OP3, the fourth opening OP4, the fifth opening OP5, and the sixth opening OP6, which are respectively included in the first wiring pattern M1, the second wiring pattern M2, the third wiring pattern M3, the fourth wiring pattern M4, the fifth wiring pattern M5, and the sixth wiring pattern M6.

The through electrode trench 180T may be formed along respective portions of the fourth wiring pattern M4, the fifth wiring pattern M5, and the sixth wiring pattern M6. For example, the respective portions of the fourth wiring pattern M4, the fifth wiring, pattern M5, and the sixth wiring pattern M6 are respectively adjacent to the fourth opening OP4, the fifth opening OP5, and the sixth opening OP6 and together form a stepwise shape. Accordingly, contact resistance between the through electrode layer 182 and the first internal wiring structure 140 may be reduced due to an increase in a contact area therebetween, and thus, the reliability of the electrical connection between the first internal wiring structure 140 and the second internal wiring structure 240 may be increased. In addition, because the through electrode trench 180T may be formed by an etching process with a high etch selectivity with respect to the first internal wiring structure 140, etch residue may be prevented from being generated from a material constituting the first internal wiring structure 140 during the process of forming the through electrode trench 180T.

Figure 3A:
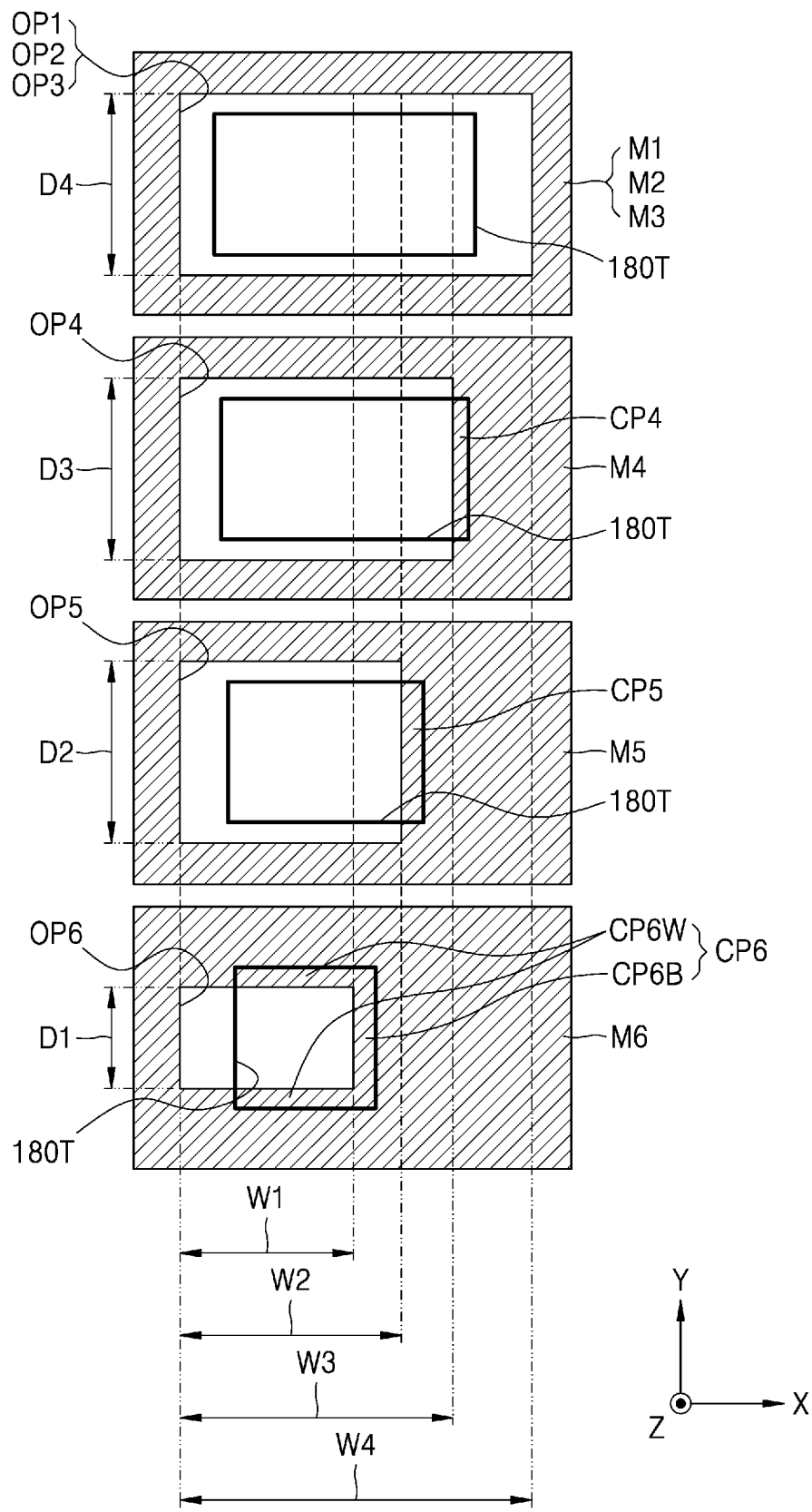
FIGS. 3A and 3B are each a plan view illustrating first wiring layers of an image sensor, according to an exemplary embodiment of the present inventive concept.
Figure 3B:
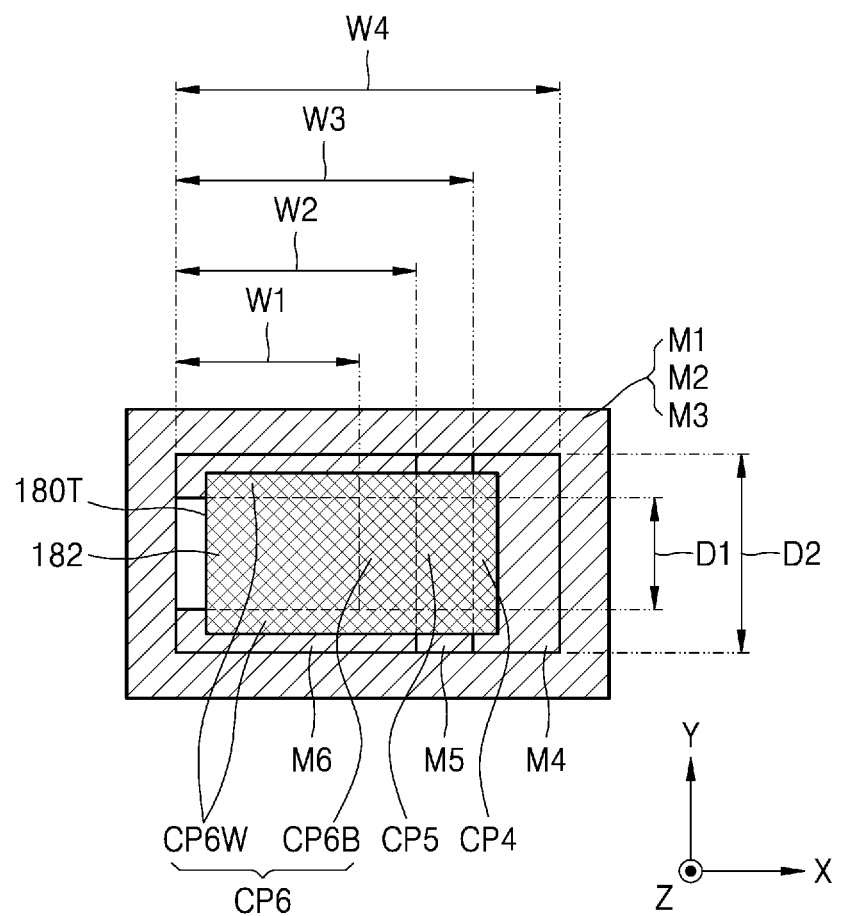

FIGS. 3A and 3B are each a plan view illustrating a first internal wiring structure of an image sensor, according to an exemplary embodiment of the present inventive concept.

Referring together to FIGS. 2A to 3B, the image sensor 1 includes the first wiring pattern M1 having the first opening OP1, the second wiring pattern M2 having the second opening OP2, the third wiring pattern M3 having the third opening OP3, the fourth wiring pattern M4 having the fourth opening OP4, the fifth wiring, pattern M5 having the fifth opening, OP5, and the sixth wiring pattern M6 having the sixth opening OP6. In addition, the first to sixth wiring patterns M1 to M6 may be respectively at different vertical levels. In an exemplary embodiment of the present inventive concept, because the first opening OP1, the second opening OP2, and the third opening OP3 may overlap each other in the vertical direction (e.g., the Z direction), the first wiring pattern M1 having the first opening OP1, the second wiring pattern M2 having the second opening OP2, and the third wiring pattern M3 having the third opening OP3 are illustrated together in FIGS. 3A and 3B without distinction thereof.

Regarding the through electrode trench 180T shown in FIG. 3A, a portion thereof at a vertical level of a top surface of each of the first wiring pattern M1, the second wiring pattern M2, and the third wiring pattern M3, a portion thereof at a vertical level of a top surface of the fourth wiring pattern M4, a portion thereof at a vertical level of a top surface of the fifth wiring pattern M5, and a portion thereof at a vertical level of a top surface of the sixth wiring pattern M6 are illustrated together with the first to third wiring, patterns M1 to M3, the fourth wiring pattern M4, the fifth wiring pattern M5, and the sixth wiring pattern M6, respectively. In FIG. 3B, the first wiring pattern M1 having the first opening OP1, the second wiring pattern M2 having the second opening OP2, the third wiring pattern M3 having the third opening OP3, the fourth wiring pattern M4 having the fourth opening OP4, the fifth wiring pattern M5 having the fifth opening OP5, and the sixth wiring pattern M6 having the sixth opening OP6 are illustrated together in a mutually overlapping state.

The sixth opening OP6 may have a first width W1 in the first horizontal direction (e.g., the X direction) and a first depth D1, which is less than the first width W1, in the second horizontal direction (e.g., the Y direction), and the fifth opening OP5 may have a second width W2 in the first horizontal direction (e.g., the X direction) and a second depth D2, which is less than the second width W2, in the second horizontal direction (e.g., Y direction). The fourth opening OP4 may have a third width W3 in the first horizontal direction (e.g., the X direction) and a third depth D3, which is less than the third width W3, in the second horizontal direction (e.g., the Y direction). Each of the first opening OP1, the second opening OP2, and the third opening OP3 may have a fourth width W4 in the first horizontal direction (e.g., the X direction) and a fourth depth D4, which is less than the fourth width W4, in the second horizontal direction (e.g., the Y direction). The first width W1 may be less than the second width W2, and the second width W2 may be less than the third width W3. The third width W3 may be less than the fourth width W4. For example, the first width W1 may be about 2.5 µm, and the second width W2 may be about 2.8 µm. The third width W3 may be about 3.8 µm. The first depth D1 may be less than each of the second depth D2, the third depth D3, and the fourth depth 4. In an exemplary embodiment of the present inventive concept, the second depth D2, the third depth D3, and the fourth depth D4 may be equal to each other. For example, the first depth D1 may be less than each of the second depth D2, the third depth D3, and the fourth depth D4 by as much as about 0.2 µm.

The horizontal cross-sectional areas of the spaces respectively formed by the first opening OP1, the second opening OP2, and the third opening OP3 may be substantially equal to each other. In an exemplary embodiment of the present inventive concept, the first opening OP1, the second opening OP2, and the third opening OP3 may overlap each other in the vertical direction (e.g., the Z direction).

The horizontal cross-sectional area of the space formed by the fourth opening OP4 may be less than the horizontal cross-sectional area of the space formed by each of the first opening OP1, the second opening OP2, and the third opening OP3. The horizontal cross-sectional area of the space formed by the fifth opening OP5 may be less than the horizontal cross-sectional area of the space formed by the fourth opening OP4, and the horizontal cross-sectional area of the space formed by the sixth opening OP6 may be less than the horizontal cross-sectional area of the space formed by the fifth opening OP5. In an exemplary embodiment of the present inventive concept, in the vertical direction (e.g., the Z direction), the sixth opening OP6 may overlap and be completely within the fifth opening OP5, and the fifth opening OP5 may overlap and be completely within the fourth opening OP4. In addition, the fourth opening OP4 may overlap and be completely within the third opening OP3.

For example, each of the first opening OP1, the second opening OP2, the third opening OP3, the fourth opening OP4 the fifth opening OP5, and the sixth opening OP6 may have a polygonal shape (e.g., a square or rectangular shape) in a plan view. For example, in a plan view, the first opening OP1, the second opening OP2, the third opening OP3, the fourth opening OP4, the fifth opening OP5, and the sixth opening OP6 may be aligned with each other in the vertical direction (e.g., the Z direction). For example, the first opening OP1, the second opening OP2, the third opening OP3, the fourth opening OP4, the fifth opening OP5, and the sixth opening OP6 may be aligned with each other in terms of one side from among the four sides of each rectangular shape thereof, for example, in terms of the left side of each rectangular shape in FIG. 3A. In an exemplary embodiment of the present inventive concept, in a plan view, the first opening OP1, the second opening OP2, and the third opening OP3 may be aligned with each other in the vertical direction (e.g., the Z direction) in terms of the four sides of each rectangular shape thereof. In in an exemplary embodiment of the present inventive concept, in a plan view, the first opening OP1, the second opening OP2, the third opening OP3, the fourth opening OP4, and the fifth opening OP5 may be aligned with each other in the vertical direction (e.g., the Z direction), in terms of three sides from among the four sides of each rectangular shape thereof, for example, in terms of the left, upper, and lower sides of each rectangular shape in FIG. 3A. In an exemplary embodiment of the present inventive concept, in a plan view, although the sixth opening OP6 may be aligned with each of the first opening OP1, the second opening OP2, the third opening OP3, the fourth opening OP4, and the fifth opening OP5 in the vertical direction (e.g., the Z direction) in terms of one side from among the four sides of each rectangular shape thereof, the sixth opening OP6 may not be aligned with each of the first opening OP1, the second opening OP2, the third opening OP3, the fourth opening OP4, and the fifth opening OP5 in the vertical direction (Z direction) in terms of the remaining three sides of each rectangular shape thereof. For example, the sixth opening OP6 may be aligned with each of the first opening OP1, the second opening OP2, the third opening OP3, the fourth opening OP4, and the fifth opening OP5 in the vertical direction (e.g., the Z direction) in terms of the left side of each rectangular shape thereof.

Respective portions of the fourth wiring pattern M4, the fifth wiring pattern M5, and the sixth wiring pattern M6, which respectively face aligned sides (e.g., the left sides in FIG. 3A) of the fourth opening OP4, the fifth opening OP5, and the sixth opening OP6 and are respectively adjacent to non-aligned sides (e.g., the right sides in FIG. 3A) of the fourth opening OP4, the fifth opening OP5, and the sixth opening OP6, may form a stepwise structure together. The aligned sides correspond to one side from among the four sides of each rectangular shape of the fourth opening OP4, the fifth opening OP5, and the sixth opening OP6 and are aligned with each other. In addition, the non-aligned sides correspond to another side of each rectangular shape of the fourth opening OP4, the fifth opening OP5, and the sixth opening OP6 and are not aligned with each other.

A portion of the first wiring pattern M1, which corresponds to a side of the rectangular shape of the first opening OP1 in a plan view, may be referred to as an inner side surface of the first wiring pattern M1. A portion of the second wiring pattern M2, which corresponds to a side of the rectangular shape of the second opening OP2 in a plan view, may be referred to as an inner side surface of the second wiring pattern M2. A portion of the third wiring pattern M3, which corresponds to a side of the rectangular shape of the third opening OP3 in a plan view, may be referred to as an inner side surface of the third wiring pattern M3. A portion of the fourth wiring pattern M4, which corresponds to a side of the rectangular shape of the fourth opening OP4 in a plan view, may be referred to as an inner side surface of the fourth wiring pattern M4. A portion of the fifth wiring pattern M5, which corresponds to a side of the rectangular shape of the fifth opening OP5 in a plan view, may be referred to as an inner side surface of the fifth wiring pattern M5, and a portion of the sixth wiring pattern M6, which corresponds to a side of the rectangular shape of the sixth opening OP6 in a plan view, may be referred to as an inner side surface of the sixth wiring pattern M6.

For example, the through electrode trench 180T may have a rectangular shape in a plan view. In a plan view, the horizontal cross-sectional area of the space formed by the through electrode trench 180T may be less than the horizontal cross-sectional area of the space formed by each of the first opening OP1, the second opening OP2, and the third opening OP3, which are respectively included in the first wiring pattern M1, the second wiring pattern M2, and the third wiring pattern M3. For example, the horizontal cross-sectional area of the space formed by the through electrode trench 180T may be less than the horizontal cross-sectional area of the space formed by the first opening OP1 at the same vertical level as the first wiring pattern M1, may be less than the horizontal cross-sectional area of the space formed by the second opening OP2 at the same vertical level as the second wiring pattern M2, and may be less than the horizontal cross-sectional area of the space formed by the third opening OP3 at the same vertical level as the third wiring pattern M3.

For example, the space formed by the through electrode trench 180T may be apart from the first wiring pattern M1 and included in the space formed by the first opening OP1 at the same vertical level as the first wiring pattern M1. As an additional example, the space formed by the through electrode trench 180T may be apart from the second wiring pattern M2 and included in the space formed by the second opening OP2 at the same vertical level as the second wiring pattern M2, and may be apart from the third wiring pattern M3 and included in the space formed by the third opening OP3 at the same vertical level as the third wiring pattern M3.

In the through electrode trench 180T, the first wiring pattern M1, the second wiring pattern M2, and the third wiring pattern M3 may not be exposed, and respective portions of the fourth wiring pattern M4, the fifth wiring pattern M5, the sixth wiring pattern M6 may be exposed.

In the through electrode trench 180T, the connection portion OP4 of the fourth wiring pattern M4 may be exposed, and is a portion of the fourth wiring pattern M4, which is adjacent to one inner side surface of the fourth wiring pattern M4. In the through electrode trench 180T, the connection portion CP5 of the fifth wiring pattern M5 may be exposed, and is a portion of the fifth wiring pattern M5, which is adjacent to one inner side surface of the fifth wiring pattern M5. In the through electrode trench 180T, a portion of the sixth wiring pattern M6, which is adjacent to three inner side surfaces of the sixth wiring pattern M6, may be exposed. For example, in the through electrode trench 180T, the base connection portion CP6B of the sixth wiring pattern M6, which is a portion thereof adjacent to the whole one inner side surface of the sixth wiring pattern M6, and the wing portions CP6W of the sixth wiring pattern M6, which are portions thereof adjacent to other two inner side surfaces of the sixth wiring pattern M6, may be exposed. The base connection portion CP6B of the sixth wiring pattern M6 and the wing portions CP6W of the sixth wiring pattern M6 may be collectively referred to as the connection portion CP6 of the sixth wiring pattern M6.

In an exemplary embodiment of the present inventive concept, the connection portion CP4 of the fourth wiring pattern M4, the connection portion CP5 of the fifth wiring pattern M5, and the base connection portion CP6B of the sixth wiring pattern M6 may respectively have bar shapes or rectangular shapes extending in the second horizontal direction (e.g., the Y direction) and may form, together, a stepwise structure. The wing portions CP6W of the sixth wiring pattern M6 may have bar shapes or rectangular shapes extending in the first horizontal direction (e.g., the X direction). The wing portions CP6W of the sixth wiring pattern M6 may include two wing shapes respectively extending from both ends of the base connection portion CP6B of the sixth wiring pattern M6 in the first horizontal direction (e.g., the X direction) different from the second horizontal direction (e.g., the Y direction), which is an extension direction of the base connection portion CP6B of the sixth wiring pattern M6. For example, the connection portion CP6 of the sixth wiring pattern M6, which is exposed by the through electrode trench 180T, may have a U shape in a plan view.

Figure 4A:
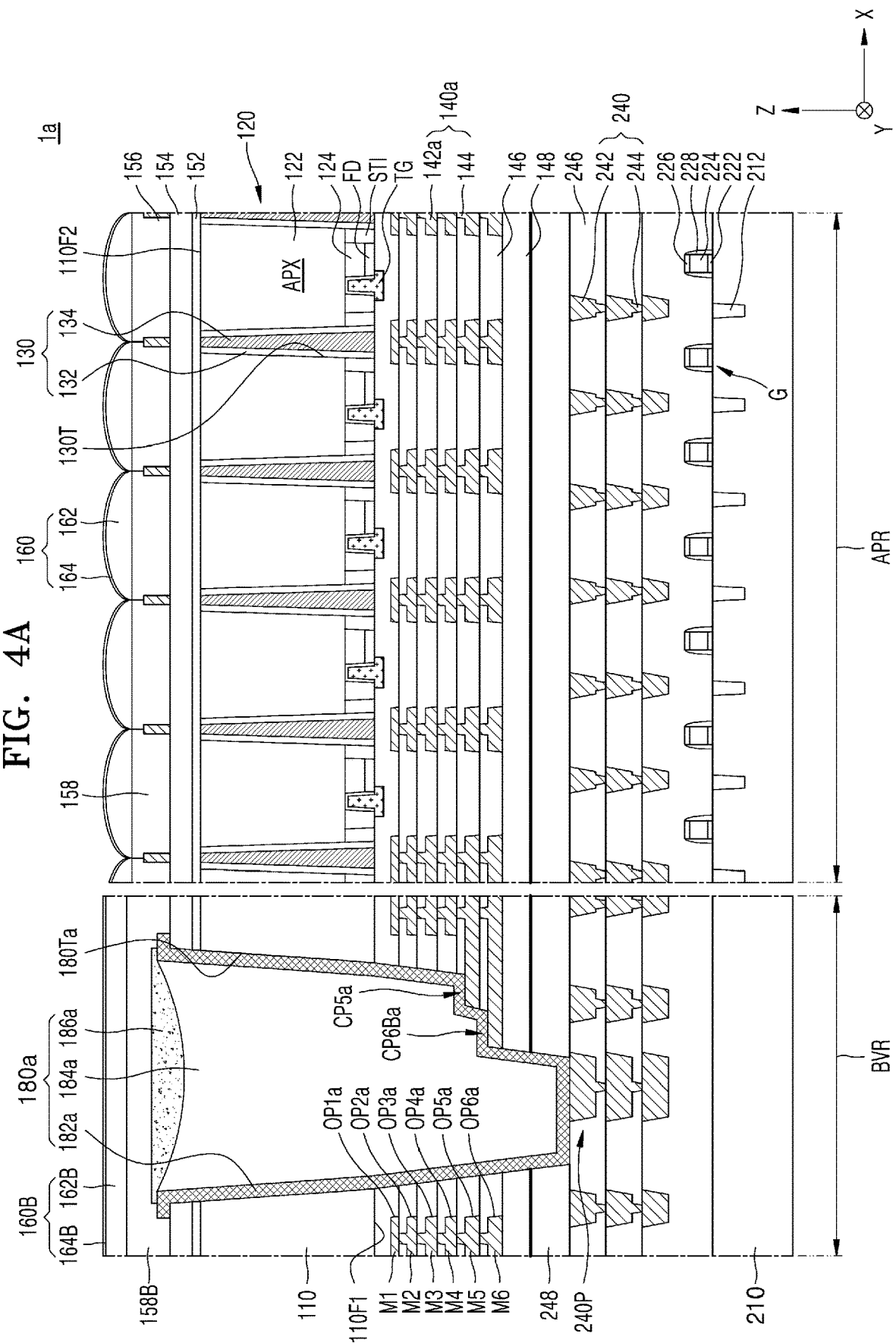
FIGS. 4A and 4B are each a plan view illustrating an image sensor, according to an exemplary embodiment of the present inventive concept.
Figure 4B:
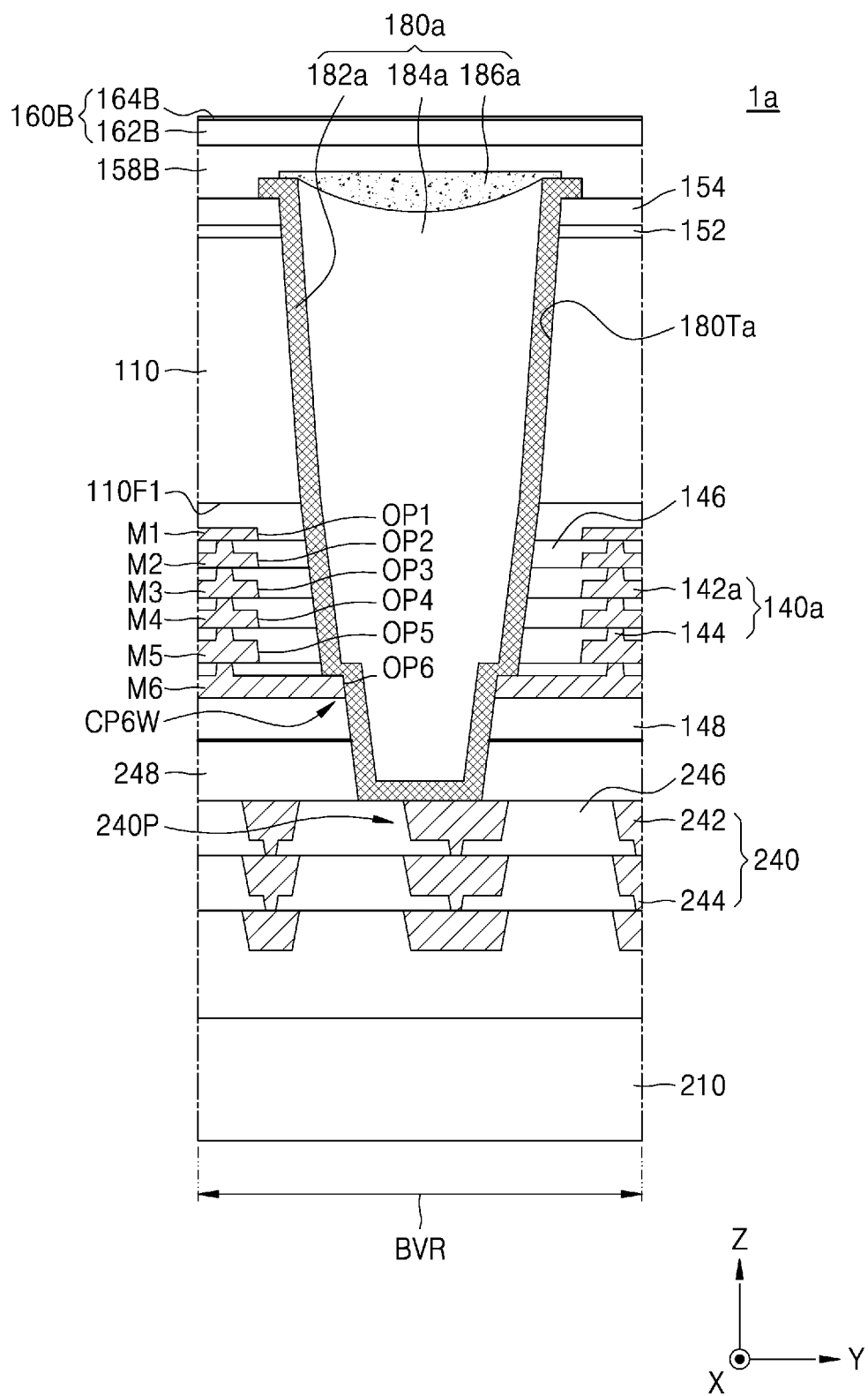

FIGS. 4A and 4B are each a plan view illustrating an image sensor, according to an exemplary embodiment of the present inventive concept. Regarding FIGS. 4A and 4B, the same components are denoted by the same reference numerals as in FIGS. 1 to 2B, and repeated descriptions given with reference to FIGS. 1 to 2B are omitted.

Referring together to FIGS. 4A and 4B, an image sensor 1a may have a stack structure in which the first substrate 110 and the second substrate 210 are bonded to each other. The image sensor 1a may include the active pixel region APR, which is formed in the first substrate 110, and the through electrode region BVR.

A first internal wiring structure 140a may be arranged on the first substrate 110. The first internal wiring structure 140a may be disposed on the first surface 110F1. The first internal wiring structure 140a may include a stack structure of a plurality of first internal wiring patterns 142a and the plurality of first internal wiring vias 144.

The plurality of first internal wiring patterns 142a may include the first wiring pattern M1, the second wiring pattern M2, the third wiring pattern M3, the fourth wiring pattern M4, the fifth wiring pattern M5, and the sixth wiring pattern M6, which are at different vertical levels from each other.

The first wiring pattern M1, the second wiring pattern M2, the third wiring pattern M3, the fourth wiring pattern M4, the fifth wiring pattern M5, and the sixth wiring pattern M6 may have a first opening OP1a, a second opening OP2a, a third opening OP3a, a fourth opening OP4a, a fifth opening OP5a, and a sixth opening OP6a, respectively. The first opening OP1a, the second opening OP2a, the third opening OP3a, the fourth opening OP4a, the fifth opening OP5a, and the sixth opening OP6a may be substantially the same as the first opening OP1, the second opening OP2, the third opening OP3, the fourth opening OP4, the fifth opening OP5, and the sixth opening OP6, which are shown in FIGS. 2A to 3B, respectively. Unlike the fourth opening OP4 shown in FIGS. 2A to 3B, a horizontal cross-sectional area of a space formed by the fourth opening OP4a may be substantially equal to a horizontal cross-sectional area of a space formed by each of the first opening OP1a, the second opening OP2a, and the third opening OP3a.

The first interlayer dielectric 146 may be arranged on the first substrate 110 to at least partially surround the first internal wiring structure 140a. For example, the first interlayer dielectric 146 may be arranged on the first surface 110F1 of the first substrate 110.

A through electrode trench 180Ta may expose a portion of the second internal wiring structure 240 at a bottom surface of the through electrode trench 180Ta, which penetrates the backside insulating layer 152, the first substrate 110, the first interlayer dielectric 146, the first cover insulating film 148, and the second cover insulating film 248.

For example, the through electrode trench 180Ta may have a rectangular shape in a plan view. In a plan view, a horizontal cross-sectional area of a space formed by the through electrode trench 180Ta may be less than the horizontal cross-sectional area of the space formed by each of the first opening OP1a, the second opening OP2a, the third opening OP5a, and the fourth opening OP4a, which are respectively included in the first wiring pattern M1, the second wiring pattern M2, the third wiring pattern M3, and the fourth wiring pattern M4. For example, the horizontal cross-sectional area of the space formed by the through electrode trench 180Ta may be less than the horizontal cross-sectional area of the space formed by the first opening OP1a at the same vertical level as the first wiring pattern M1, than the horizontal cross-sectional area of the space formed by the second opening OP2a at the same vertical level as the second wiring pattern M2, than the horizontal cross-sectional area of the space formed by the third opening OP3a at the same vertical level as the third wiring pattern M3, and than the horizontal cross-sectional area of the space formed by the fourth opening OP4a at the same vertical level as the fourth wiring pattern M4.

In the through electrode trench 180Ta, a portion of the first internal wiring structure 140a may be exposed. In an exemplary embodiment of the present inventive concept, in the through electrode trench 180Ta, the first wiring pattern M1, the second wiring pattern M2, the third wiring pattern M3, and the fourth wiring pattern M4 may not be exposed, and respective portions of the fifth wiring pattern M5 and the sixth wiring pattern M6 may be exposed.

In the through electrode trench 180Ta, a connection portion CP5a of the fifth wiring pattern M5, which is adjacent to one inner side surface of the fifth wiring pattern M5, may be exposed. In the through electrode trench 180Ta, at least one portion of the sixth wiring pattern M6, which is adjacent to three inner side surfaces of the sixth wiring pattern M6, may be exposed. For example, in the through electrode trench 180Ta, a base connection portion CP6Ba of the sixth wiring pattern M6, which is a portion thereof adjacent to one inner side surface of the sixth wiring pattern M6, and wing portions CP6Wa of the sixth wiring pattern M6, which are portions thereof adjacent to other two inner side surfaces of the sixth wiring pattern M6, may be exposed. The base connection portion CP6Ba of the sixth wiring pattern M6 and the wing portions CP6Wa of the sixth wiring pattern M6 may be collectively referred to as a connection portion (CP6a in FIGS. 5A and 5B) of the sixth wiring pattern M6.

In an exemplary embodiment of the present inventive concept, the connection portion CP5a of the fifth wiring pattern M5 and the base connection portion CP6Ba of the sixth wiring pattern M6 may respectively have bar shapes or rectangular shapes extending in the second horizontal direction (e.g., the Y direction) and may form, together, a stepwise structure. The wing portions CP6Wa of the sixth wiring pattern M6 may have bar shapes extending in the first horizontal direction (e.g., the X direction). The wing portions CP6Wa of the sixth wiring pattern M6 may include two wing shapes respectively extending from both ends of the base connection portion CP6Ba of the sixth wiring pattern M6 in the first horizontal direction (e.g., the X direction) different from the second horizontal direction (e.g., the Y direction), which is an extension direction of the base connection portion CP6Ba of the sixth wiring pattern M6. For example, the connection portion CP6a of the sixth wiring pattern M6, which is exposed by the through electrode trench 180Ta, may have a U shape or a polygonal shape with an open side in a plan view.

A through electrode structure 180a may include a through electrode layer 182a, which conformally covers an inner wall and a bottom surface of the through electrode trench 180Ta, and a filling insulating layer 184a, which covers the through electrode layer 182a and fills the remaining portion of the through electrode trench 180Ta. In an exemplary embodiment of the present inventive concept, the through electrode structure 180a may include a cover insulating layer 186a, which fills an upper portion of the through electrode trench 180Ta. In an exemplary embodiment of the present inventive concept, the through electrode structure 180a may include only the through electrode layer 182a completely filling the inside of the through electrode trench 180Ta without including the filling insulating layer 184a.

The through electrode layer 182a may contact and be electrically connected to the respective portions of the fifth wiring pattern M5 and the sixth wiring pattern M6, which are portions of the first internal wiring structure 140a. For example, the through electrode layer 182a may contact and be electrically connected to the connection portion CP5a of the fifth wiring pattern M5 and the connection portion CP6a of the sixth wiring pattern M6, which includes the base connection portion CP6Ba of the sixth wiring pattern M6 and the wing portions CP6Wa of the sixth wiring pattern M6. The through electrode layer 182a may contact and be electrically connected to the stack connection pad 240P, which is a portion of the second internal wiring structure 240. Accordingly, the through electrode layer 182a may electrically connect the first internal wiring structure 140a to the second internal wiring structure 240. For example, the through electrode layer 182a may have a stepwise shape along top and side surfaces of each of the connection portion CP5a of the fifth wiring pattern M5 and the base connection portion CP6Ba of the sixth wiring pattern M6. For example, from a cross-sectional view, the base connection portion CP6Ba of the sixth wiring pattern M6, which is disposed below the connection portion CP5a of the fifth wiring pattern M5, may extend farther than the connection portion CP5a of the fifth wiring pattern M5. The through electrode layer 182a may have a stepwise shape along top and side surfaces of each of the wing portions CP6Wa of the sixth wiring pattern M6.

In the image sensor 1a according to an exemplary embodiment of the present inventive concept, the first internal wiring structure 140a may be electrically connected to the second internal wiring structure 240 by the through electrode layer 182a at least partially filling the through electrode trench 180Ta that extends through the first opening OP1a, the second opening OP2a, the third opening OP3a, the fourth opening OP4a, the fifth opening OP5a, and the sixth opening OP6a, which are respectively included in the first wiring pattern M1, the second wiring pattern M2, the third wiring pattern M3, the fourth wiring pattern M4, the fifth wiring pattern M5, and the sixth wiring pattern M6.

The through electrode trench 180Ta may be formed along respective portions of the fifth wiring pattern M5 and the sixth wiring pattern M6, the respective portions being respectively adjacent to the fifth opening OP5a and the sixth opening OP6a and together forming a stepwise shape. Accordingly, contact resistance between the through electrode layer 182a and the first internal wiring structure 140a may be reduced due to an increase in a contact area therebetween, and thus, the reliability of the electrical connection between the first internal wiring structure 140a and the second internal wiring structure 240 may be increased. In addition, because the through electrode trench 180Ta may be formed by an etching process with a high etch selectivity with respect to the first internal wiring structure 140a, etch residue may be prevented from being generated from a material constituting the first internal wiring structure 140a during the process of forming the through electrode trench 180Ta.

Figure 5A:
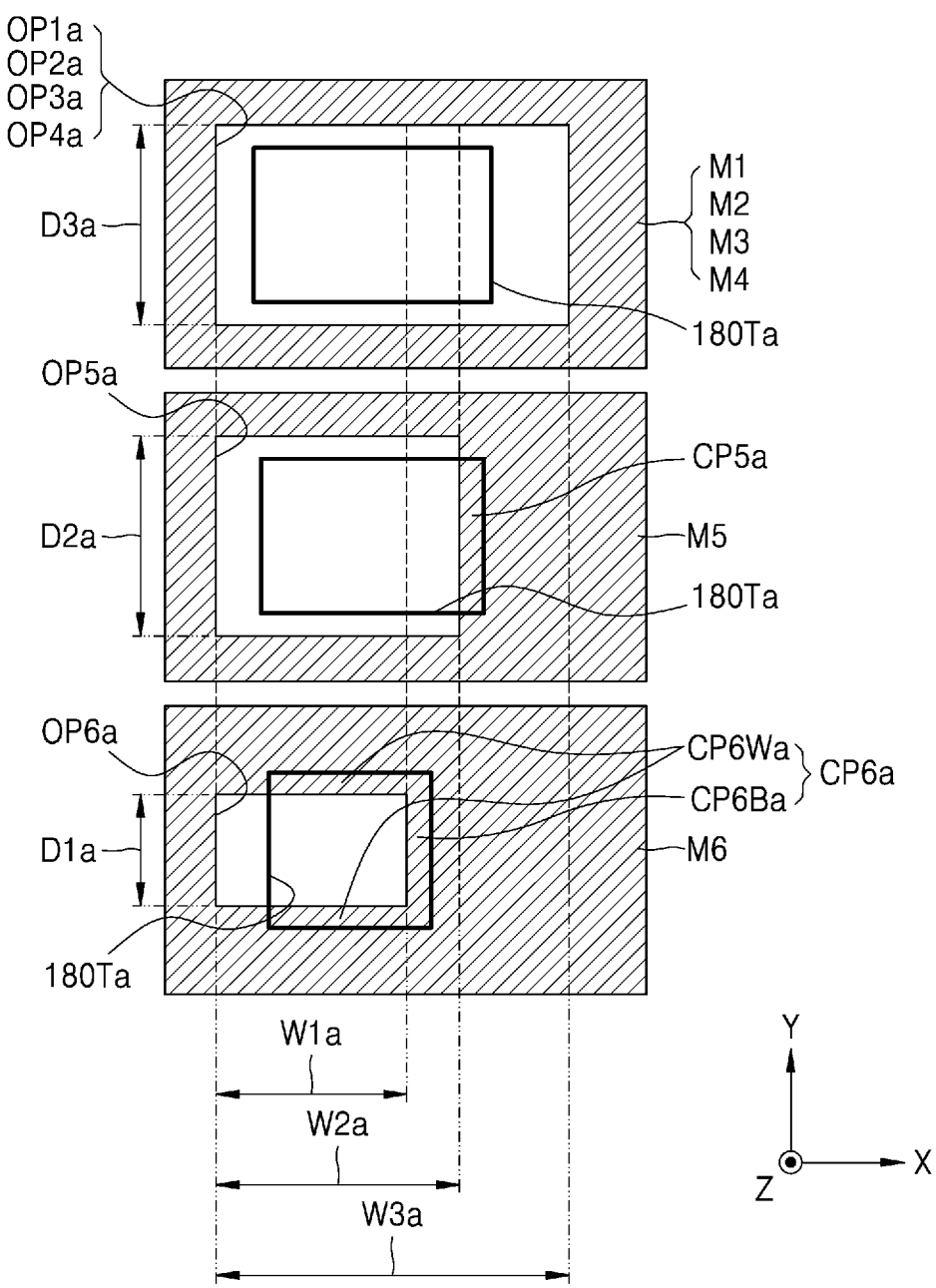
FIGS. 5A and 5B are each a plan view illustrating first wiring layers of an image sensor, according to an exemplary embodiment of the present inventive concept.
Figure 5B:
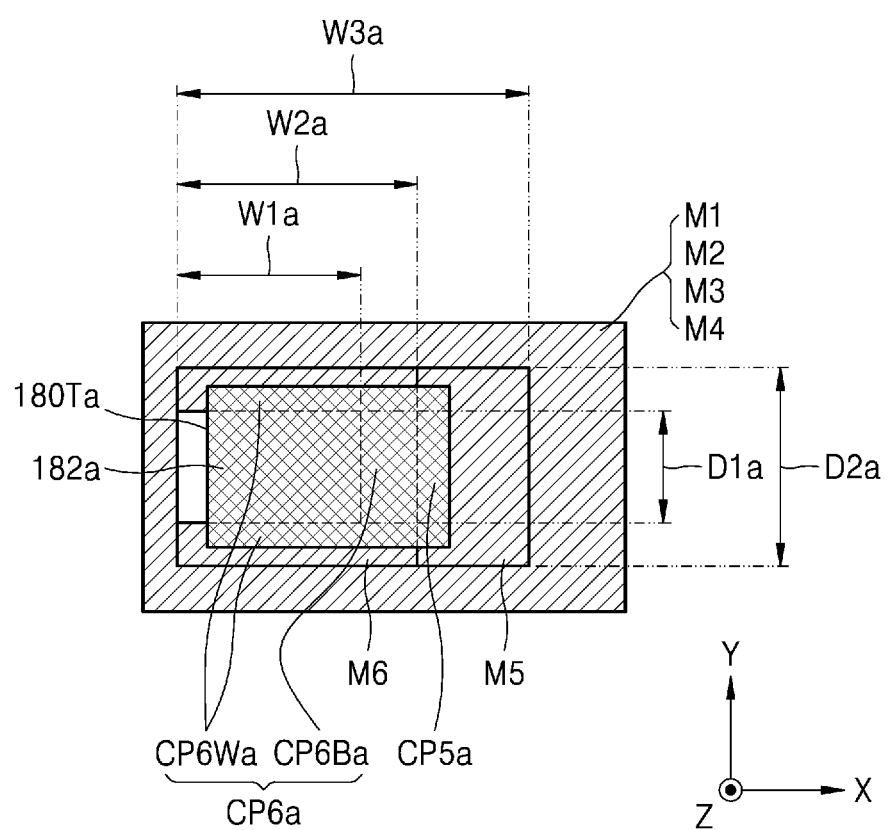

FIGS. 5A and 5B are each a plan view illustrating a first internal wiring structure of an image sensor, according to an exemplary embodiment of the present inventive concept. Regarding FIGS. 5A and 5B, the same components are denoted by the same reference numerals as in FIGS. 1 to 3B, and repeated descriptions given with reference to FIGS. 1 to 3B are omitted.

Referring together to FIGS. 4A to 5B, the image sensor 1a includes the first wiring pattern M1 having the first opening OP1a, the second wiring pattern M2 having the second opening OP2a, the third wiring pattern M3 having the third opening OP3a, the fourth wiring pattern M4 having the fourth opening OP4a, the fifth wiring pattern M5 having the fifth opening OP5a, and the sixth wiring pattern M6 having the sixth opening OP6a, and the first to sixth wiring patterns M1 to M6 are at different vertical levels from each other. In an exemplary embodiment of the present inventive concept, because the first opening OP1a, the second opening OP2a, the third opening OP3a, and the fourth opening OP4a may overlap each other in the vertical direction (e.g., the Z direction), the first wiring pattern M1 having the first opening OP1a, the second wiring pattern M2 having the second opening OP2a, the third wiring pattern M3 having the third opening OP3a, and the fourth wiring pattern M4 having the fourth opening OP4a are illustrated together in FIGS. 5A and 5B without distinction thereof.

Regarding the through electrode trench 180Ta shown in FIG. 5A, a portion thereof at the vertical level of the top surface of each of the first wiring pattern M1, the second wiring pattern M2, the third wiring pattern M3, and the fourth wiring pattern M4, a portion thereof at the vertical level of the top surface of the fifth wiring pattern M5, and a portion thereof at the vertical level of the top surface of the sixth wiring pattern M6 are illustrated together with the first to fourth wiring patterns M1 to M4, the fifth wiring pattern M5, and the sixth wiring, pattern M6, respectively. In FIG. 5B, the first wiring pattern M1 having the first opening OP1a, the second wiring pattern M2 having the second opening OP2a, the third wiring pattern M3 having the third opening OP3a, the fourth wiring pattern M4 having the fourth opening OP4a, the fifth wiring pattern M5 having the fifth opening OP5a, and the sixth wiring pattern M6 having the sixth opening OP6a are illustrated together in a mutually overlapping state.

In an exemplary embodiment of the present inventive concept, in a plan view, the first opening OP1a, the second opening OP2a, the third opening OP3a, and the fourth opening OP4a may be aligned with each other in the vertical direction (e.g., the Z direction) in terms of the four sides of each rectangular shape thereof. In an exemplary embodiment of the present inventive concept, in a plan view, the first opening OP1a, the second opening OP2a, the third opening OP3a, the fourth opening OP4a, and the fifth opening OP5a may be aligned with each other in the vertical direction (e.g., the Z direction), in terms of three sides from among the four sides of each rectangular shape thereof, that is, in terms of the left, upper, and lower sides of each rectangular shape in FIG. 5A. In an exemplary embodiment of the present inventive concept, in a plan view, although the sixth opening OP6a may be aligned with each of the first opening OP1a, the second opening OP2a, the third opening OP3a, the fourth opening OP4a, and the fifth opening OP5a in the vertical direction (e.g., the Z direction) in terms of one side from among the four sides of each rectangular shape thereof, the sixth opening OP6a may not be aligned with each of the first opening OP1a, the second opening OP2a, the third opening OP3a, the fourth opening OP4a, and the fifth opening OP5a in the vertical direction (e.g., the Z direction) in terms of the remaining three sides of each rectangular shape thereof. For example, the sixth opening OP6a may be aligned with each of the first opening OP1a, the second opening OP2a, the third opening OP3a, the fourth opening OP4a, and the fifth opening OP5a in the vertical direction (e.g., the Z direction) in terms of the left side of each rectangular shape in FIG. 5A.

Respective portions of the fifth wiring pattern M5 and the sixth wiring pattern M6, which respectively face aligned sides (e.g., the left sides in FIG. 5A) of the fifth opening OP5 and the sixth opening OP6 and are respectively adjacent to non-aligned sides (e.g., the right sides in FIG. 5A) of the fifth opening OP5 and the sixth opening OP6, may form a stepwise structure together. In addition, the aligned sides correspond to one side from among the four sides of each rectangular shape of the fifth opening OP5 and the sixth opening OP6 and are aligned with each other, and the non-aligned sides correspond to another side of each rectangular shape thereof and are not aligned with each other.

In an exemplary embodiment of the present inventive concept, horizontal cross-sectional areas of spaces respectively formed by the first opening OP1a, the second opening OP2a, the third opening OP3a, and the fourth opening OP4a may be substantially equal to each other. For example, a horizontal cross-sectional area of a space formed by the fifth opening OP5a may be less than the horizontal cross-sectional area of the space formed by each of the first opening OP1a, the second opening OP2a, the third opening OP3a, and the fourth opening OP4a, and a horizontal cross-sectional area of a space formed by the sixth opening OP6a may be less than the horizontal cross-sectional area of the space formed by the fifth opening OP5a.

The sixth opening OP6a may have a first width W1a in the first horizontal direction (e.g., the X direction) and a first depth D1a in the second horizontal direction (e.g., the Y direction). The fifth opening OP5a may have a second width W2a in the first horizontal direction (e.g., the X direction) and a second depth D2a in the second horizontal direction (e.g., the Y direction), and each of the first opening OP1a, the second opening OP2a, the third opening OP3a, and the fourth opening OP4a may have a third width W3a in the first horizontal direction (e.g., the X direction) and a third depth D1a in the second horizontal direction (e.g., the Y direction). The first width W1a may be less than the second width W2a, and the second width W2a may be less than the third width W3a. The first depth D1a may be less than the second depth D2a and the third depth D3a. In an exemplary embodiment of the present inventive concept, the second depth D2a may be equal to the third depth D3a.

For example, the space formed by the through electrode trench 180Ta may be apart from the first wiring pattern M1 and included in the space formed by the first opening OP1a at the same vertical level as the first wiring pattern M1, may be apart from the second wiring pattern M2 and included in the space formed by the second opening OP2a at the same vertical level as the second wiring pattern M2, may be apart from the third wiring pattern M3 and included in the space formed by the third opening OP3a at the same vertical level as the third wiring pattern M3, and may be apart from the fourth wiring pattern M4 and included in the space formed by the fourth opening OP4a at the same vertical level as the fourth wiring pattern M4. In the through electrode trench 180Ta, the first wiring pattern M1, the second wiring pattern M2, the third wiring pattern M3, and the fourth wiring pattern M4 may not be exposed, and respective portions of the fifth wiring pattern M5 and the sixth wiring pattern M6 may be exposed.

In the through electrode trench 180Ta, the connection portion CP5a of the fifth wiring pattern M5 may be exposed, and the connection portion CP5a is a portion of the fifth wiring pattern M5, which is adjacent to one inner side surface of the fifth wiring pattern M5. In the through electrode trench 180Ta, at least one portion of the sixth wiring pattern M6, which is adjacent to three inner side surfaces of the sixth wiring pattern M6, may be exposed. For example, in the through electrode trench 180Ta, the base connection portion CP6Ba of the sixth wiring pattern M6, which is a portion thereof adjacent to one inner side surface of the sixth wiring pattern M6, and the wing portions CP6Wa of the sixth wiring pattern M6, which are portions thereof adjacent to other two inner side surfaces of the sixth wiring pattern M6, may be exposed. The base connection portion CP6Ba of the sixth wiring pattern M6 and the wing portions CP6Wa of the sixth wiring pattern M6 may be collectively referred to as the connection portion CP6a of the sixth wiring pattern M6.

FIGS. 6 to 14 are cross-sectional views illustrating a method of fabricating an image sensor, according to an embodiment of the present inventive concept. Regarding FIGS. 6 to 14, the same components are denoted by the same reference numerals as in FIGS. 1 to 5B, and repeated descriptions given with reference to FIGS. 1 to 5B are omitted.

Figure 6:
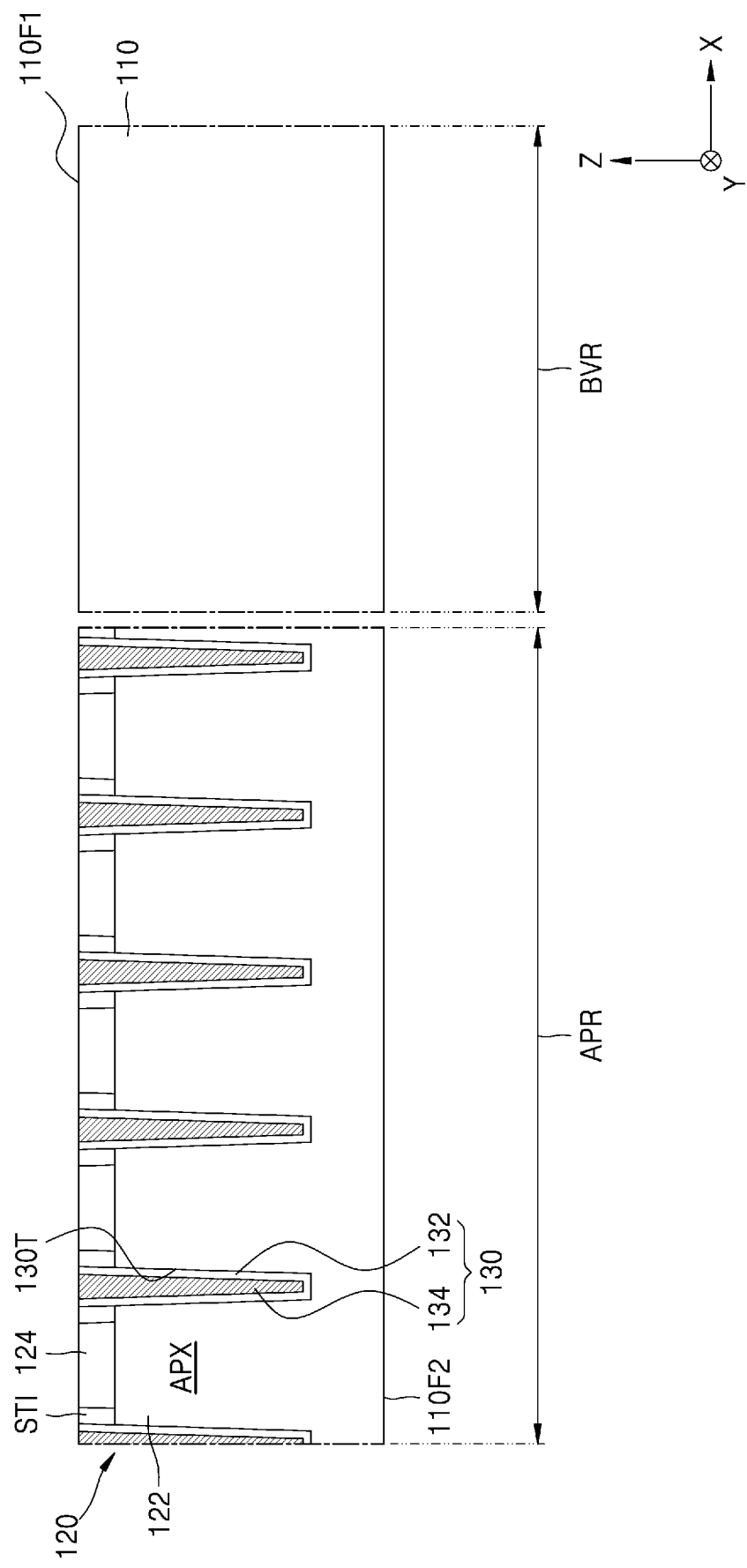
FIGS. 6, 7, 8, 9, 10, 11, 12, 13 and 14 are cross-sectional views illustrating a method of fabricating an image sensor, according to an exemplary embodiment of the present inventive concept.

Referring to FIG. 6, the first substrate 110 including the first surface 110F1 and the second surface 110F2, which are opposite to each other, is prepared. The photoelectric conversion region 120 including the photodiode region 122 and the well region 124 may be formed by performing an ion implantation process on the first surface 110F1 of the first substrate 110. For example, the photodiode region 122 may be formed by doping the first substrate 110 with N-type impurities, and the well region 124 may be formed by doping the first substrate 110 with P-type impurities.

Next, a mask pattern may be formed on the first surface 110F1 of the first substrate 110, and a device isolation trench may be formed in the first substrate 110 by using the mask pattern. An insulating material may fill the device isolation trench, and the device isolation film STI may be formed by planarizing the first substrate 110 to expose the first surface 110F1 of the first substrate 110.

Next, a mask pattern may be formed on the first surface 110F1 of the first substrate 110, and the pixel trench 130T may be formed in the first substrate 110 by using the mask pattern. For example, the pixel trench 130T may have a grid shape in a plan view.

Next, an insulating layer may be conformally formed on the first surface 110F1 of the first substrate 110 and an inner wall of the pixel trench 130T, and a conductive layer may be formed on the insulating layer to fill an inside of the pixel trench 130T. Then, the insulating layer and the conductive layer may be partially removed to expose the first surface 110F1 of the first substrate 110, whereby the insulating liner 132, which covers the inner wall of the pixel trench 130T, and the filling conductive layer 134, which is arranged on the insulating liner 132 to fill the inside of the pixel trench 130T, may be formed.

Figure 7:
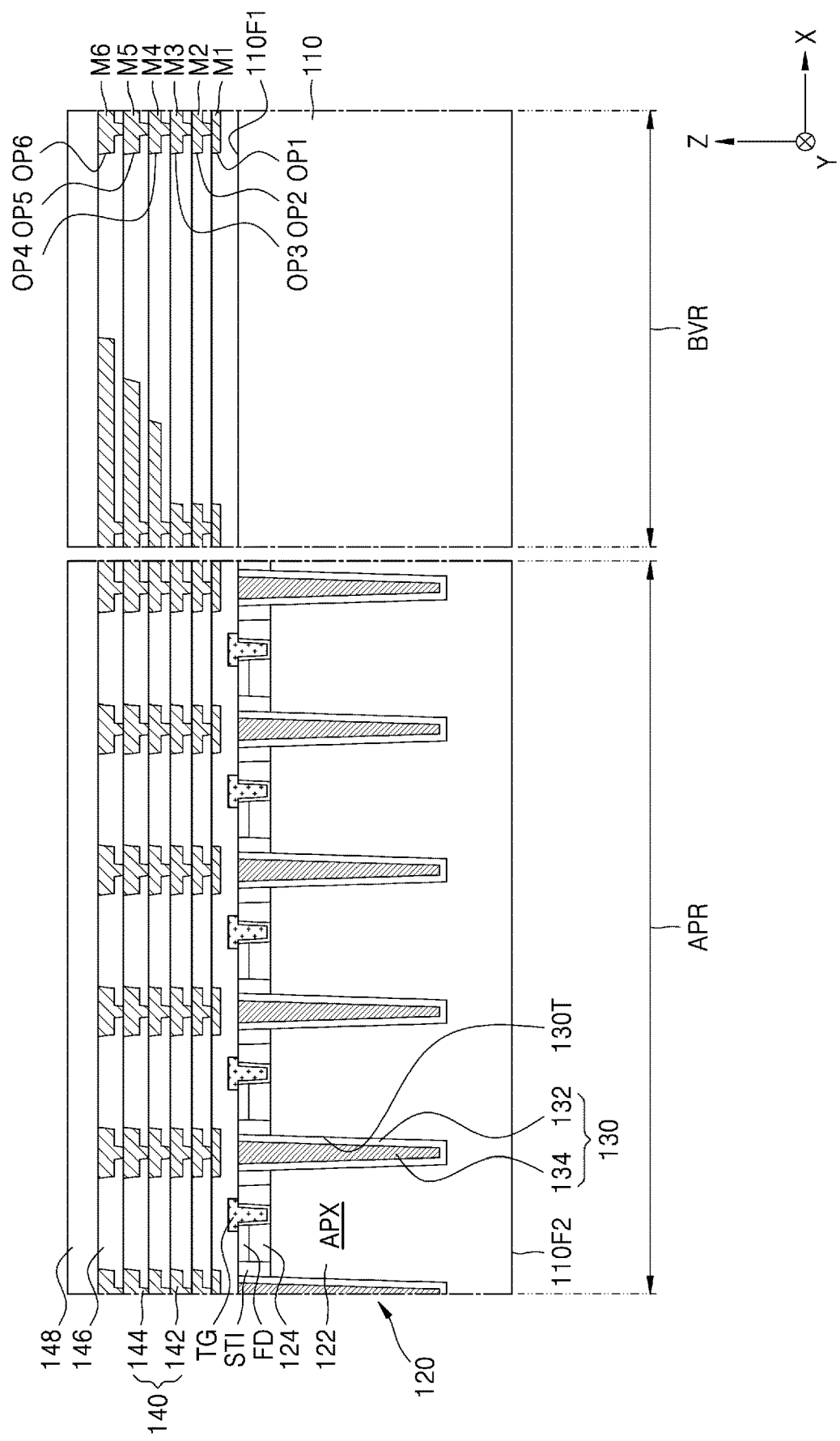

Referring to FIG. 7, gate electrodes including the transmission gate TG may be formed on the first surface 110F1 of the first substrate 110, and the floating diffusion region FD and an active region may be formed by performing an ion implantation process on some regions of the first surface 110F1 of the first substrate 110.

Next, the first internal wiring structure 140 and the first interlayer dielectric 146 may be formed on the first surface 110F1 of the first substrate 110. The first interlayer dielectric 146 covers the first internal wiring structure 140. In an exemplary embodiment of the present inventive concept, the first internal wiring structure 140 and the first interlayer dielectric 146 may be formed by a damascene process. Next, the first cover insulating film 148 may be formed to cover the first interlayer dielectric 146.

Figure 8:
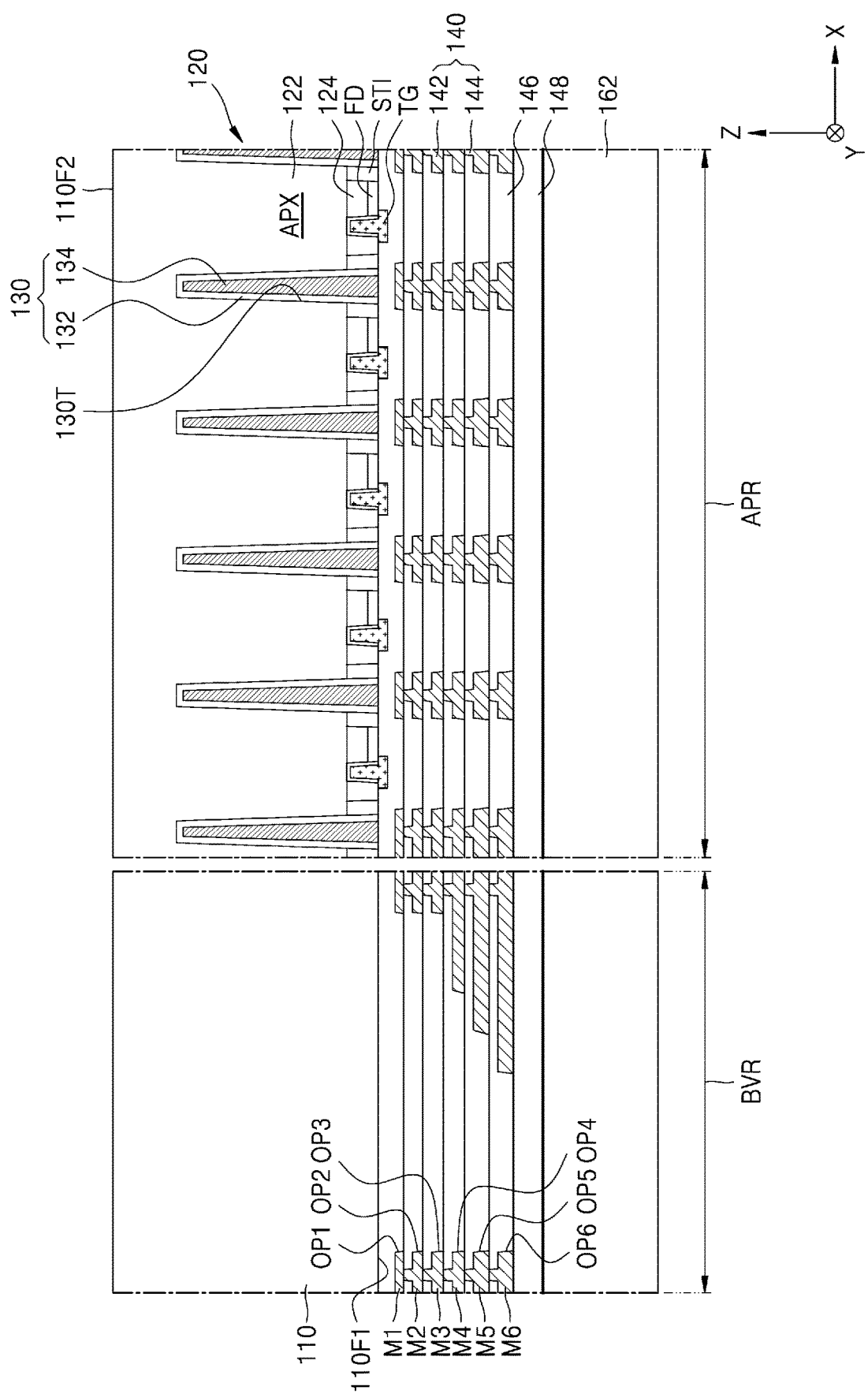

Referring to FIG. 8, a support substrate 162 may be bonded to the first surface 110F1 of the first substrate 110, and then, the first substrate 110 may be inverted upside down such that the second surface 110F2 of the first substrate 110 faces upwards.

Figure 9:
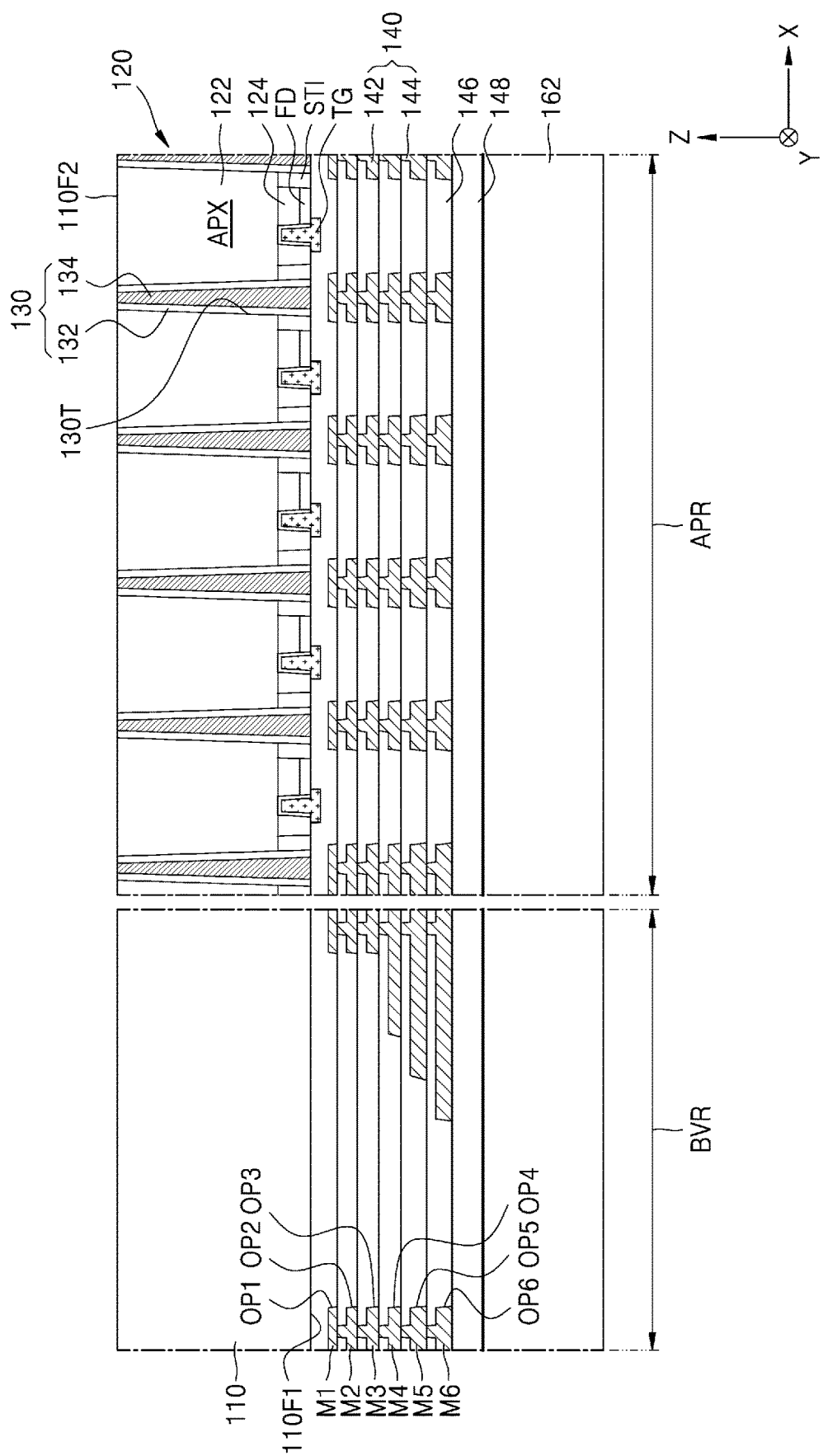

Referring to FIG. 9, the first substrate 110 may be partially removed from the second surface 110F2 of the first substrate 110, which is shown in FIG. 8, by a planarization process such as a CMP process or an etch-back process such that a surface of the filling conductive layer 134 is exposed. For example, the surface of the filling conductive layer 134 that is nearest the second surface 110F2 of the first substrate 110 is exposed. As the above-described removal process is performed, a vertical level of the second surface 110F2 of the first substrate 110, which is shown in FIG. 9, may be lower than the vertical level of the second surface 110F2 of the first substrate 110, which is shown in FIG. 8. One active pixel APX surrounded by the pixel device isolation film 130 may be physically and electrically separated from the active pixel APX adjacent thereto. The pixel device isolation film 130 may extend from the first surface 110F1 of the first substrate 110 to the second surface 110F2 of the first substrate 110, and a height of the pixel device isolation film 130 may be substantially equal to a height of the first substrate 110.

Figure 10:
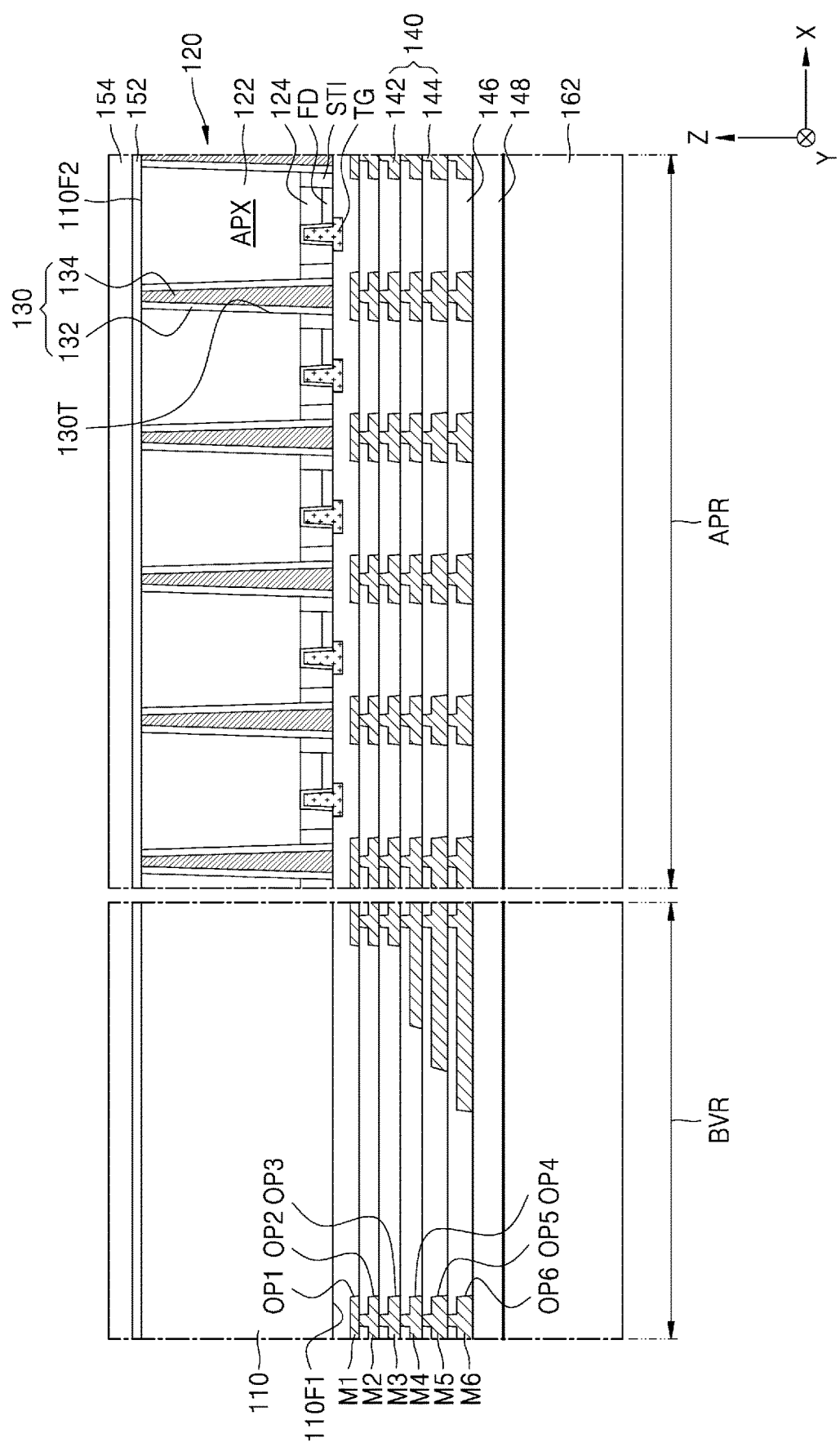

Referring to FIG. 10, the backside insulating layer 152 and the passivation layer 154 may be formed on the second surface 110F2 of the first substrate 110, and the passivation layer 154 may cover the backside insulating layer 152. The backside insulating layer 152 may be conformally formed on the pixel device isolation film 130 and the second surface 110F2 of the first substrate 110.

Figure 11:
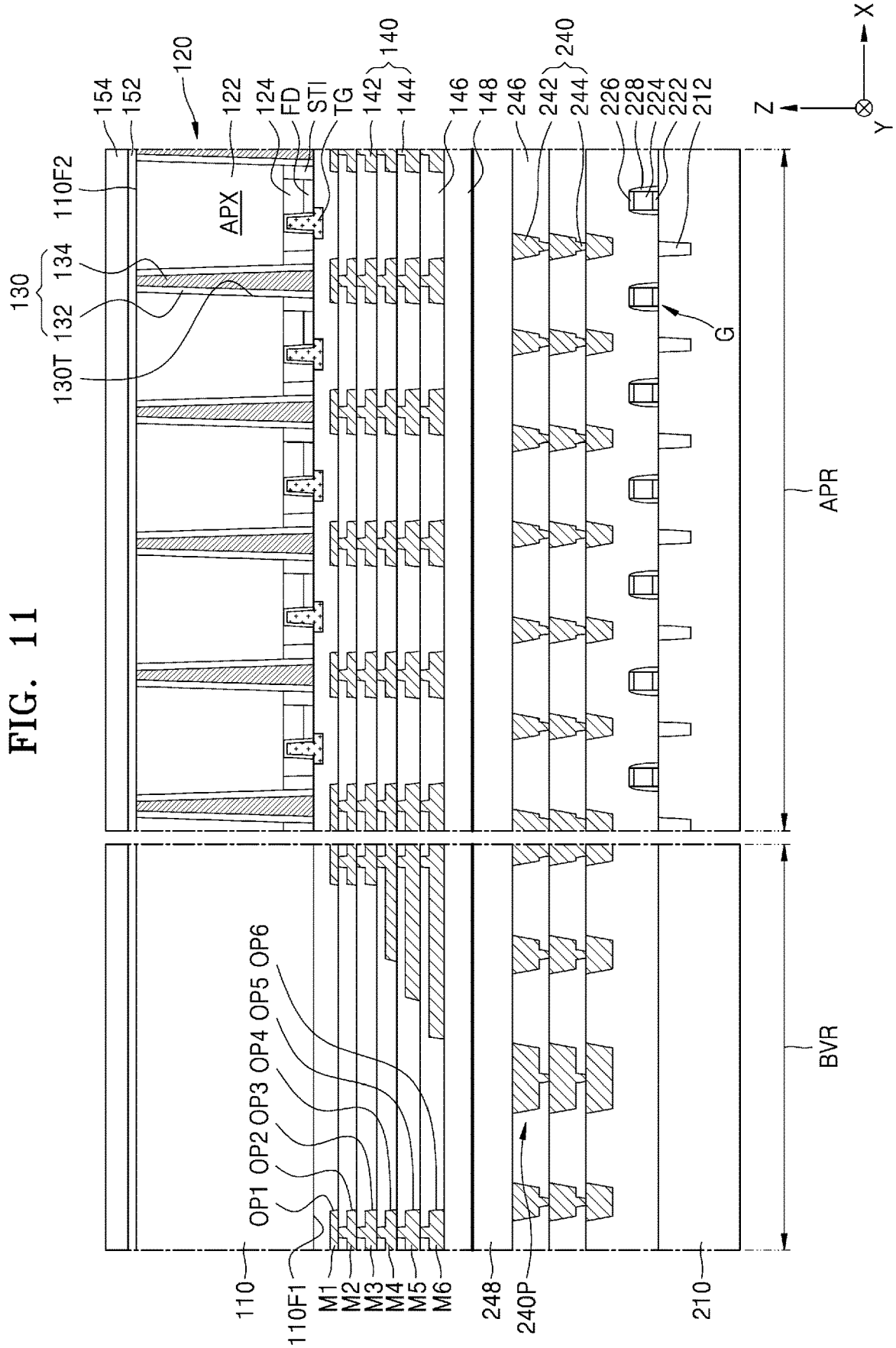

Referring together to FIGS. 10 and 11, the support substrate 162 may be removed from the first substrate 110, and then, the first cover insulating film 148 over the first substrate 110 may be attached to the second cover insulating film 248 over the second substrate 210, in an exemplary embodiment of the present inventive concept, the first cover insulating film 148 and the second cover insulating film 248 may be attached to each other by, for example, an oxide-oxide direct bonding method. In an exemplary embodiment of the present inventive concept, a bonding member may be arranged between the first cover insulating film 148 and the second cover insulating film 248.

Figure 12:
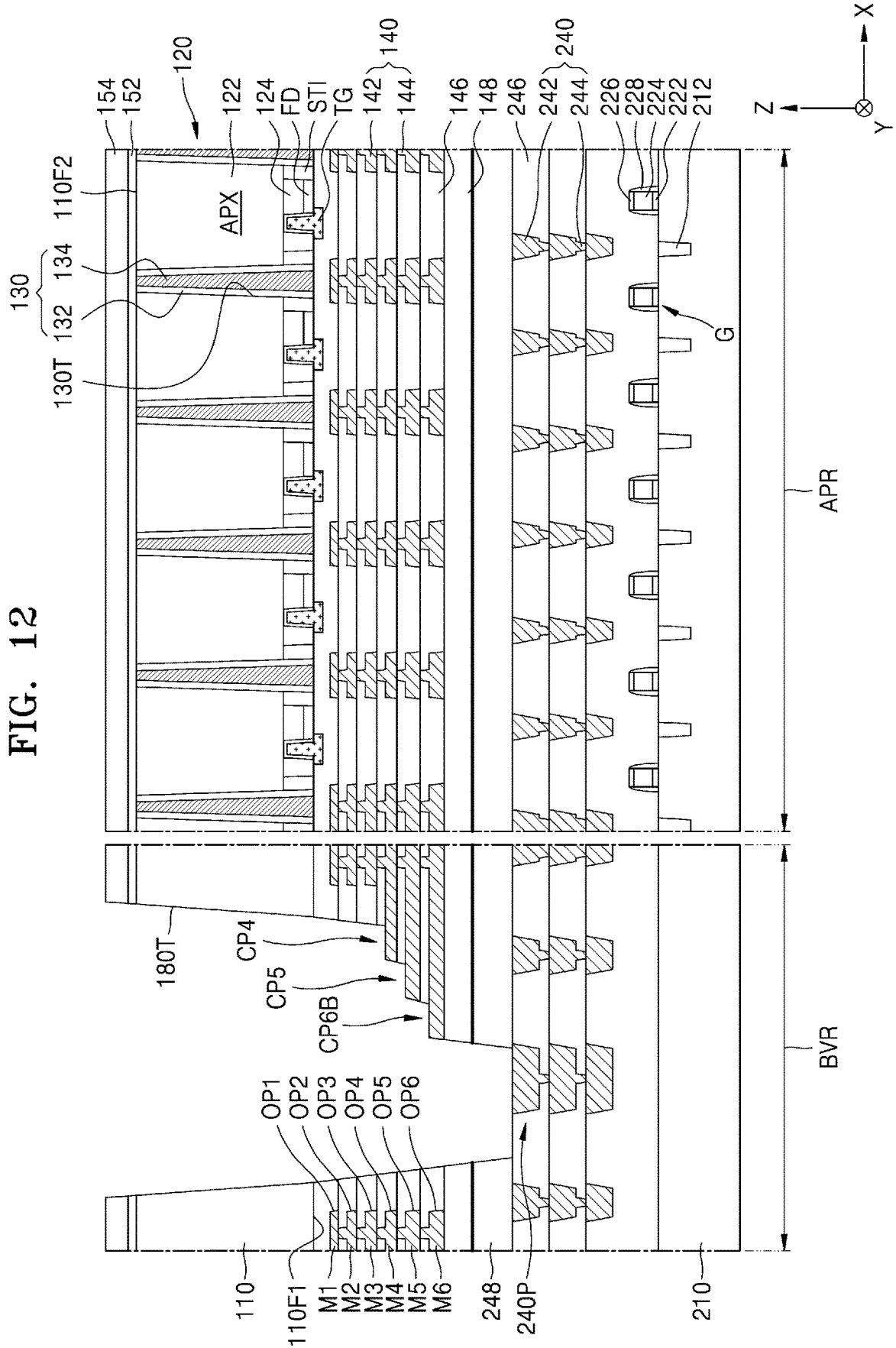

Referring to FIG. 12, the passivation layer 154, the backside insulating layer 152, the first substrate 110, the first interlayer dielectric 146, the first cover insulating film 148, and the second cover insulating film 248 may be partially removed, thereby forming the through electrode trench 180T, which exposes the stack connection pad 240P at the bottom surface of the through electrode trench 180T. The stack connection pad 240P is a portion of the second internal wiring structure 240. In the through electrode trench 180T, the first wiring pattern M1, the second wiring pattern M2, and the third wiring pattern M3 may not be exposed, and the connection portion CP4 of the fourth wiring pattern M4, the connection portion CP5 of the fifth wiring pattern M5, the base connection portion CP6B of the sixth wiring pattern M6, and the wing portions (CP6W in FIG. 2B) of the sixth wiring pattern M6 may be exposed.

The through electrode trench 180T may be formed by an etching process with a high etch selectivity with respect to the first internal wiring structure 140, and thus, etch residue may be prevented from being generated from a material constituting the first internal wiring structure 140 during the process of forming the through electrode trench 180T.

The through electrode trench 180Ta shown in FIGS. 4A to 5B may be formed to expose the connection portion CP5a of the fifth wiring pattern M5, the base connection portion CP6Ba of the sixth wiring pattern M6, and the wing portions (CP6Wa in FIG. 4B) of the sixth wiring, pattern M6 and formed simultaneously not to expose the first wiring pattern M1, the second wiring pattern M2, the third wiring pattern M3, and the fourth wiring pattern M4.

Figure 13:
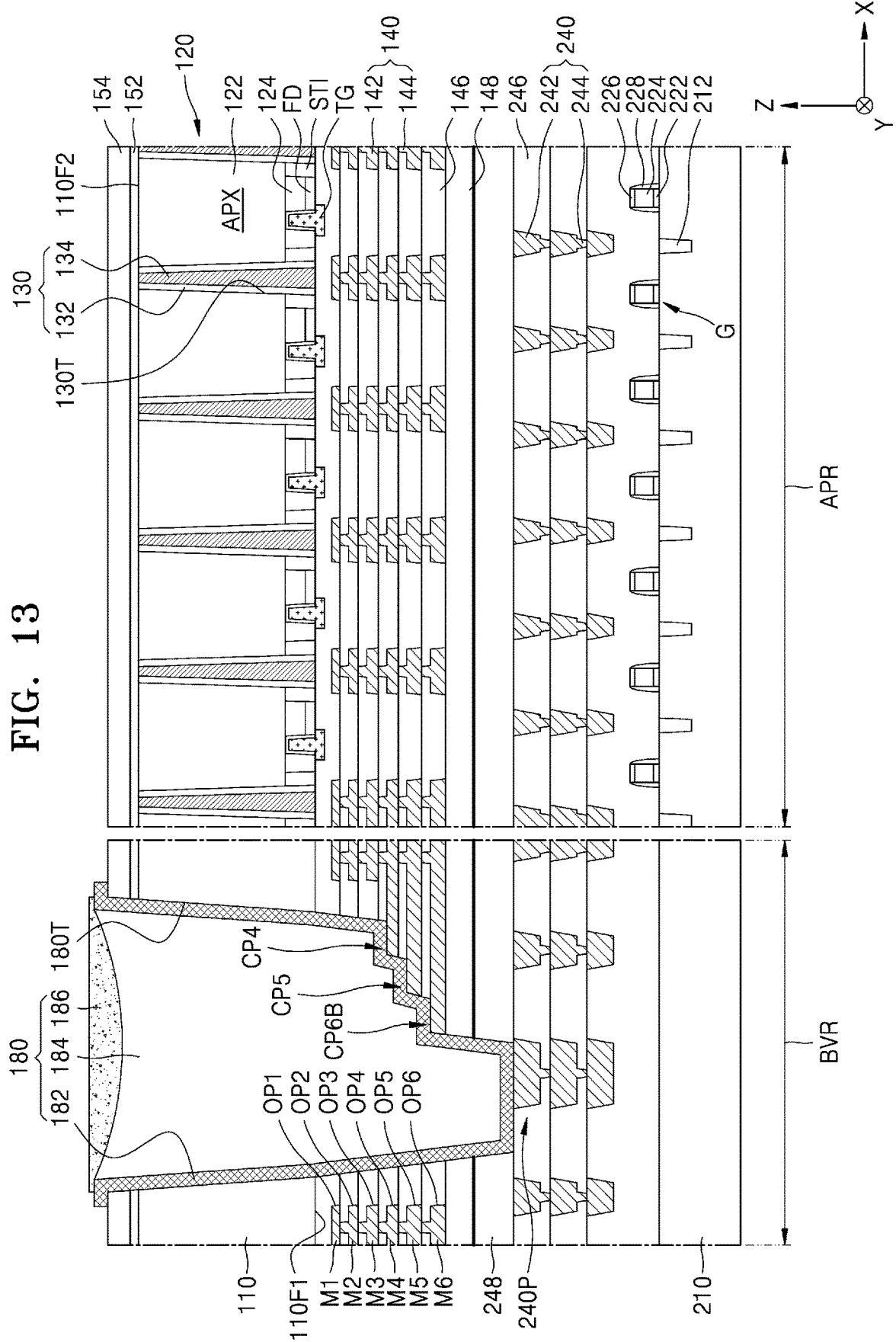

Referring to FIG. 13, the through electrode structure 180 including the through electrode layer 182 and the filling insulating layer 184 is formed. The through electrode layer 182 conformally covers the inner wall and the bottom surface of the through electrode trench 180T, and the filling insulating layer 184 covers the through electrode layer 182 and at least partially fills the through electrode trench 180T. In an exemplary embodiment of the present inventive concept, the through electrode structure 180 may include the cover insulating layer 186. The cover insulating layer 186 may be formed to protrude upwards from the uppermost end of the through electrode layer 182 while filling an upper portion of the through electrode trench 180T. For example, the cover insulating layer 186 may be disposed on the filling insulating layer 184.

Figure 14:
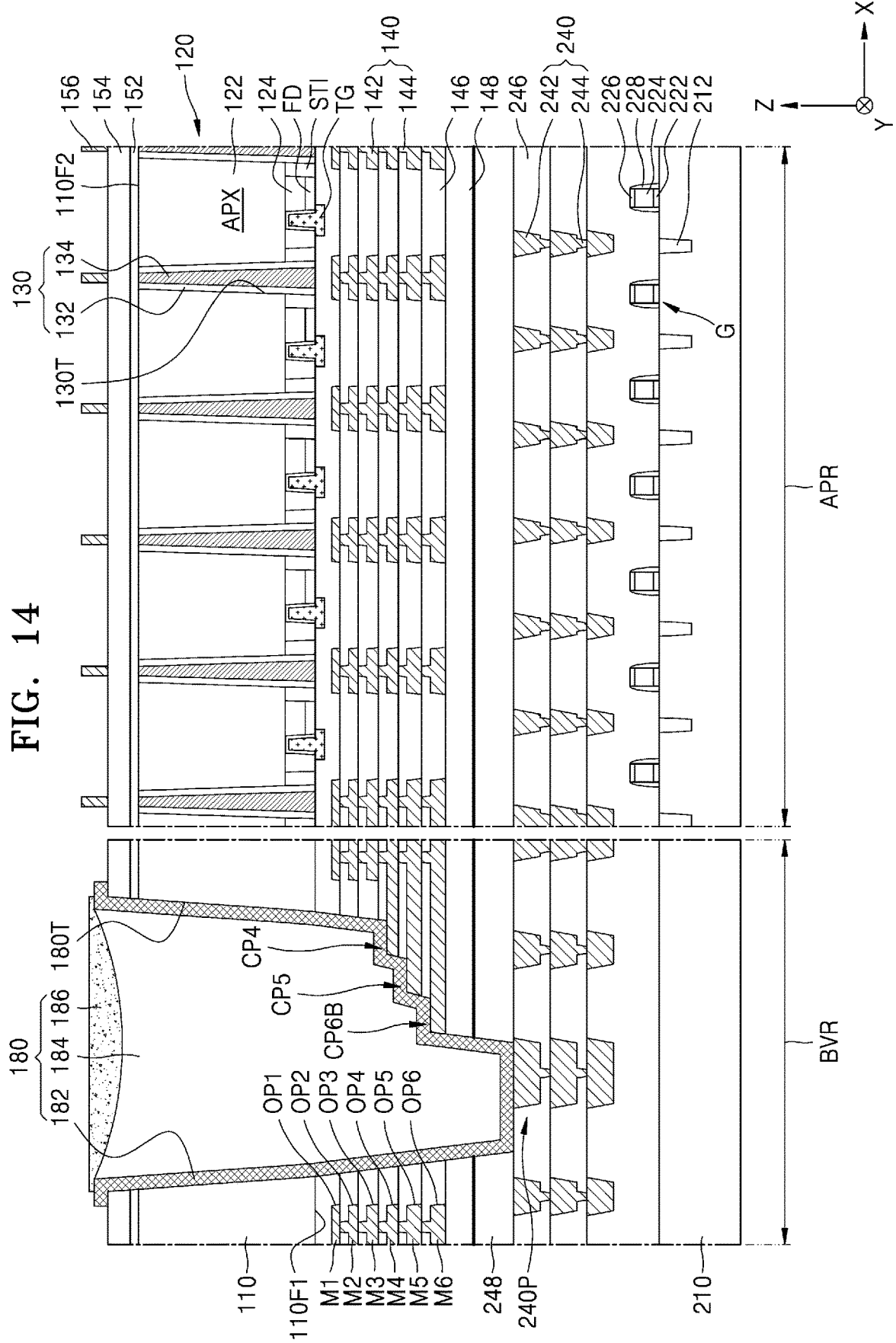

Referring to FIG. 14, a conductive layer may be formed on the passivation layer 154, and the guide pattern 156 may be formed by patterning the conductive layer. The guide pattern 156 may have a grid shape or a mesh shape in a plan view. In an exemplary embodiment of the present inventive concept, the light blocking layer BPC shown in FIG. 1 may be formed together with the guide pattern 156. In an exemplary embodiment of the present inventive concept, the guide pattern 156 may be formed before the through electrode trench 180T formed.

Next, as shown in FIG. 2A, the color filter layer 158 and the microlens 160 may be formed on the passivation layer 154 in the active pixel region APR, and the bulk color filter layer 158B and the bulk protection layer 160B may be formed on the passivation layer 154 in the through electrode region BVR, thereby forming the image sensor 1.

Figure 15:
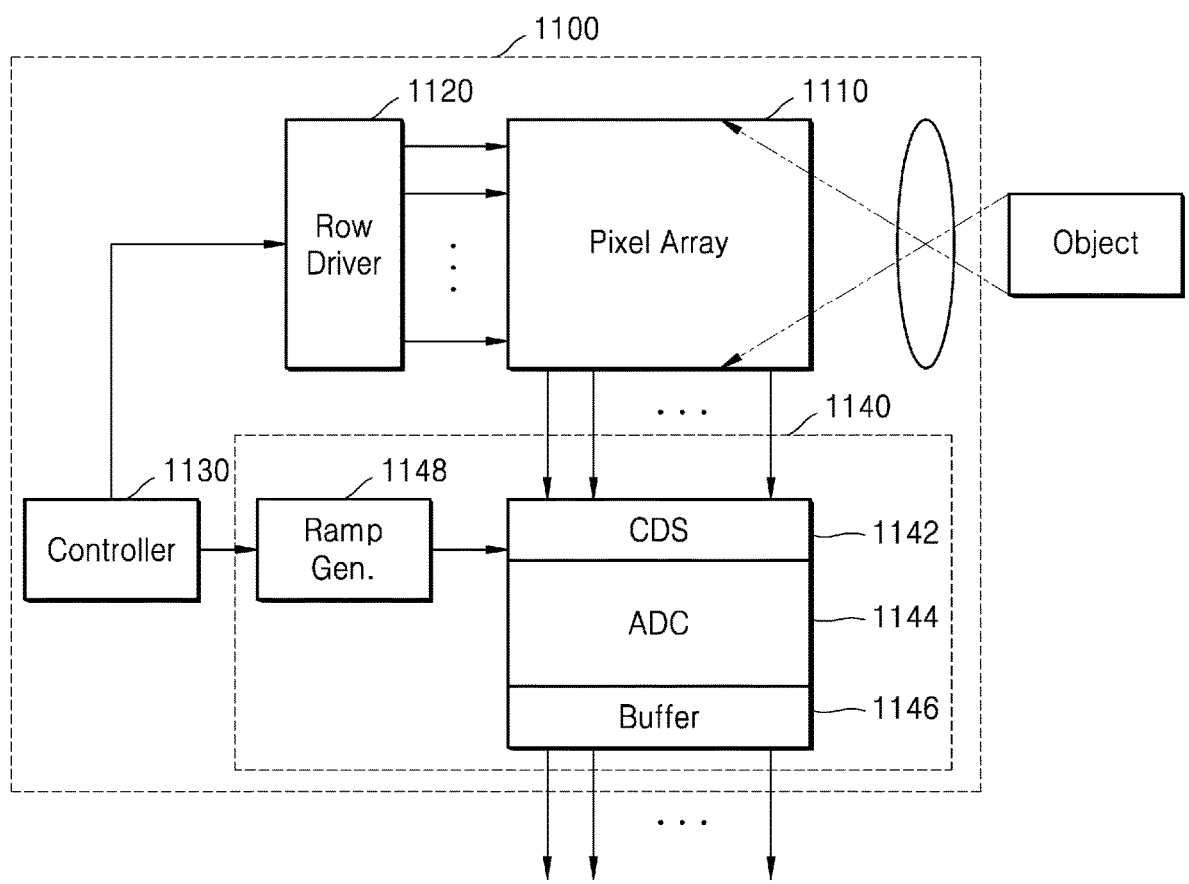
FIG. 15 is a block diagram illustrating a configuration of an image sensor, according to an exemplary embodiment of the present inventive concept.

FIG. 15 is a block diagram illustrating a configuration of an image sensor, according to an exemplary embodiment of the present inventive concept.

Referring to FIG. 15, an image sensor 1100 may include a pixel array 1110, a controller 1130, a row driver 1120, and a pixel signal processing unit 1140. The image sensor 1100 includes at least one of the image sensors 1 and/or 1*a* described with reference to FIGS. 1 to 14.

The pixel array 1110 may include a plurality of unit pixels that are two-dimensionally arranged, and each unit pixel may include an organic photoelectric conversion device. The photoelectric conversion device may generate electric charges by absorbing light, and electrical signals (e.g., output voltages) according to the generated electric charges may be provided to the pixel signal processing unit 1140. The unit pixels included in the pixel array 1110 may provide output voltages on a row basis, one row at a time, and accordingly, the unit pixels in one row of the pixel array 1110 may be simultaneously activated by a selection signal that is output by the row driver 1120. Each of the unit pixels in the selected row may provide an output voltage, according to absorbed light, to an output line of a corresponding column.

The controller 1130 may control the row driver 1120 such that the pixel array 1110 accumulates electric charges by absorbing light or temporarily stores the accumulated electric charges and outputs electrical signals according to the stored electric charges to an outside of the pixel array 1110. In addition, the controller 1130 may control the pixel signal processing unit 1140 to measure the output voltages provided by the pixel array 1110.

The pixel signal processing unit 1140 may include a correlated double sampler (CDS) 1142, an analog-to-digital converter (ADC) 114, and a buffer 1146. The CDS 1142 may sample and hold the output voltages provided by the pixel array 1110. The CDS 1142 may sample a certain noise level and a level according to the generated output voltage twice, and thus, may output a level corresponding to a difference therebetween. In addition, the CDS 1142 may receive ramp signals generated by a ramp signal generator 1148, compare the ramp signals with each other, and output a comparison result. The ADC 1144 may convert analog signals, which corresponds to the level received from the CDS 1142, into digital signals. The buffer 1146 may latch the digital signals, and the latched signals may be sequentially output to an outside of the image sensor 1100 and be transferred to an image processor.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. An image sensor comprising:
a first structure comprising a first substrate and a first internal wiring structure disposed below the first substrate, wherein the first substrate includes a first surface, a second surface opposite to the first surface, an active pixel region, and a through electrode region disposed adjacent to the active pixel region, wherein a plurality of active pixels are arranged in the active pixel region; and wherein the first internal wiring structure comprises a plurality of first internal wiring patterns;
a second structure comprising a second substrate and a second internal wiring structure on the second substrate, wherein the second substrate includes a driving circuit configured to drive the plurality of active pixels and is arranged on the first substrate; and
a through electrode layer in the through electrode region, wherein the through electrode layer at least partially fills a through electrode trench and connects the first internal wiring structure to the second internal wiring structure,
wherein the plurality of first internal wiring patterns comprise a first wiring pattern having a first opening, a second wiring pattern having a second opening, and a third wiring pattern having a third opening, wherein the first wiring pattern, the second wiring pattern, and the third wiring pattern are at different levels from each other sequentially from the first surface of the first substrate, and
wherein the through electrode layer contacts each of a connection portion of the second wiring pattern and a connection portion of the third wiring pattern due to the through electrode trench extending through the first opening, the second opening, and the third opening, wherein the connection portion of the second wiring pattern has a rectangular shape, and the connection portion of the third wiring pattern has a U shape,
wherein the connection portion of the third wiring pattern includes a first inner edge portion, a second inner edge portion that is opposite to the first inner edge portion, and a third inner edge portion that connects to the first inner edge portion and the second inner edge portion,
wherein the through electrode layer contacts the first inner edge portion, the second inner edge portion, and the edge inner portion.

2. The image sensor of claim 1, wherein each of the first opening, the second opening, and the third opening has a rectangular shape, and the first opening, the second opening, and the third opening are aligned with each other with respect to one side from among four sides of each rectangular shape of each of the first opening, the second opening, and the third opening.

3. The image sensor of claim 2, wherein the connection portion of the second wiring pattern is a portion thereof adjacent to at least one of the four sides of the rectangular shape of the second opening, wherein the connection portion of the third wiring pattern is a portion thereof adjacent to at least one of the four sides of the rectangular shape of the third opening, and wherein the at least one side of the rectangular shape of the second opening and the at least one side of the rectangular shape of the third opening are not aligned with each other.

4. The image sensor of claim 2, wherein the third opening is not aligned with the first opening and the second opening with respect to remaining three sides from among the four sides of each rectangular shape of the first opening, the second opening and the third opening.

5. The image sensor of claim 4, wherein the connection portion of the third wiring pattern is adjacent to the remaining three sides of the rectangular shape of the third opening.

6. The image sensor of claim 2, wherein the first opening and the second opening are aligned with each other with respect to three sides from among the four sides of each rectangular shape of the first opening and the second opening and are not vertically aligned with each other with respect to a remaining one side of each rectangular shape of the first opening and the second opening.

7. The image sensor of claim 6, wherein the connection portion of the second wiring pattern is adjacent to the remaining one side of the rectangular shape of the second opening.

8. The image sensor of claim 2, wherein the first opening, the second opening, and the third opening are not vertically aligned with each other with respect to another side facing the aligned one side of each rectangular shape of the first opening, the second opening and third opening.

9. The image sensor of claim 1, wherein a horizontal cross-sectional area of a space formed by each of the first opening, the second opening, and the third opening decreases with an increasing distance from the second surface of the first substrate.

10. The image sensor of claim 2, wherein the plurality of first internal wiring patterns further comprise a fourth wiring pattern at a level between the second wiring pattern and the third wiring pattern, wherein the fourth wiring pattern has a fourth opening with a rectangular shape and contacts the through electrode layer,
- one side from among four sides of the rectangular shape of the fourth opening is aligned with the aligned one side of each rectangular shape of the first opening, the second opening, and the third opening, and
- remaining three sides of the rectangular shape of the fourth opening are not aligned with remaining three sides of the rectangular shape of the third opening.

11. The image sensor of claim 10, wherein the second opening and the fourth opening are aligned with each other with respect to three sides from among the four sides of each rectangular shape of the second opening and the fourth opening and are not aligned with each other with respect to a remaining one side of each rectangular shape of the second opening and the fourth opening.

* * * * *